United States Patent [19]
Tsuchida et al.

[11] Patent Number: 6,060,918
[45] Date of Patent: May 9, 2000

[54] START-UP CIRCUIT

[75] Inventors: Kazuhito Tsuchida, Itami; Naoko Suwa, Osaka, both of Japan

[73] Assignee: Mitsubishi Denki Kabushiki Kaisha, Tokyo, Japan

[21] Appl. No.: 08/281,168

[22] Filed: Jul. 27, 1994

[30] Foreign Application Priority Data

Aug. 17, 1993 [JP] Japan .................................... 5-203462
Mar. 29, 1994 [JP] Japan .................................... 6-059080

[51] Int. Cl.[7] ...................................................... G05F 1/10
[52] U.S. Cl. ........................................... 327/143; 327/537
[58] Field of Search .................................... 323/312, 313, 323/315, 316; 327/143, 513, 535, 537, 542, 543

[56] References Cited

U.S. PATENT DOCUMENTS

| | | | |
|---|---|---|---|
| 4,340,851 | 7/1982 | Nishikawa | 323/311 |
| 4,342,926 | 8/1982 | Whatley | 323/315 |
| 4,504,743 | 3/1985 | Aoyama et al. | 257/380 |
| 4,769,589 | 9/1988 | Rosenthal | 323/315 |
| 4,837,496 | 6/1989 | Erdi | 323/315 |
| 4,890,052 | 12/1989 | Hellums | 323/316 |
| 5,029,295 | 7/1991 | Bennett et al. | 323/316 |
| 5,034,626 | 7/1991 | Pirez et al. | 323/316 |
| 5,180,967 | 1/1993 | Yamazaki | 323/315 |
| 5,243,231 | 9/1993 | Baik | 327/535 |
| 5,293,112 | 3/1994 | Takahashi | 323/315 |
| 5,296,765 | 3/1994 | Willams et al. | 327/379 |

OTHER PUBLICATIONS

Gray & Meyer, Analysis and Design of Analog Integrated Circuits, John Wiley & Sons, Inc New York 1993.
Sedra & Smith, 'Microelectronic Circuits', Saunders College Publishing 1991, pp. 308 & A4.

*Primary Examiner*—Jeffrey Zweizig
*Attorney, Agent, or Firm*—Oblon, Spivak, McClelland, Maier & Neustadt, P.C.

[57] ABSTRACT

There is disclosed a start-up circuit (3a) wherein a plurality of NMOSs (Q8 to Q10) are connected in series between the drain of a PMOS (Q1) and a ground potential point (2) and connected at their gate to a power-supply potential point (1), and wherein a voltage drop at the NMOSs (Q8 to Q10) generates a gate potential of a PMOS (Q2) for supplying current to a bias supply circuit (4). By using the voltage drop of the NMOSs (Q8 to Q10) having a small area, the start-up circuit including a CMOS is reduced in layout area.

31 Claims, 24 Drawing Sheets

START-UP CIRCUIT

BACKGROUND OF THE INVENTION

1. Field of the Invention

The present invention relates to a start-up circuit for starting a bias supply circuit and, more particularly, to an improvement in integration of a start-up circuit formed in a semiconductor integrated circuit.

2. Description of the Background Art

FIG. 10 is a circuit diagram of a conventional start-up circuit including a CMOS (complementary metal-oxide semiconductor). In FIG. 10, reference numeral 1 designates a power-supply potential point providing a power-supply potential $V_{DD}$; 2 designates a ground potential point providing a ground potential GND; reference character Q1 designates a P-channel MOS transistor having a source connected to the power-supply potential point 1; and R1 designates a resistor having a first end connected to the drain and gate of the P-channel MOS transistor Q1 and a second end connected to the ground potential point 2. A circuit enclosed by the dashed line indicated by reference numeral 3 is a start-up circuit. A bias supply circuit started by the start-up circuit 3 is enclosed by the dashed line indicated by reference numeral 4.

Reference character R2 designates a resistor having a first end connected to the power-supply potential point 1 and a second end connected to the bias supply circuit 4, and Q2 designates a P-channel MOS transistor having a source connected to the second end of the resistor R2 and a drain connected to the bias supply circuit 4. The P-channel MOS transistor Q2 whose gate is connected to the first end of the resistor R1 switches on/off in response to a voltage generated between the second end of the resistor R1 and the first end of the resistor R2.

The bias supply circuit 4 includes a resistor R3, PMOS transistors Q3, Q4, and NMOS transistors Q5 to Q7. Hereinafter, an N-channel MOS transistor is referred to as an NMOS, and a P-channel MOS transistor as a PMOS.

A first end of the resistor R3 and the source of the PMOS Q4 are connected to the second end of the resistor R2. The source of the PMOS Q3 is connected to a second end of the resistor R3, and the drain of the PMOS Q3 is connected to the drain of the NMOS Q5. The gate of the PMOS Q3 is connected to the gate and drain of the NMOS Q4. The drain of the NMOS Q6 is connected to the drain of the PMOS Q4, and the gate of the NMOS Q6 is connected to the gate and drain of the NMOS Q5. The sources of the NMOSs Q5, Q6 are connected to the ground potential point 2. The NMOS Q7 has a gate connected to the gate of the NMOS Q5, a source connected to the ground potential point 2, and a drain through which a DC current is supplied.

An exemplary design of the start-up circuit and bias supply circuit will be described below. It is assumed that the PMOSs Q1 to Q4, NMOSs Q5 to Q7, and resistors R1 to R3 are fabricated in the same process step. The size and characteristic values are as follows: the ratio of gate width to gate length (hereinafter referred to as W/L) of the PMOS Q1 is 200/3; the resistance of the resistor R1 is 150 kΩ; W/L of the PMOS Q2 is 30/3; the resistance of the resistor R2 is 5 kΩ; the resistance of the resistor R3 is 10 kΩ; W/L of the PMOS Q3 is 540/3; W/L of the PMOS Q4 is 40/3; and W/L of the NMOSs Q5 to Q7 is 10/2. The power-supply potential $V_{DD}$ is 5 V in normal operation.

FIG. 11 shows a layout of the start-up circuit 3 of FIG. 10 enlarged about 550 times. In FIG. 11, reference numeral 10 designates a gate electrode; 11 designates a source electrode; 12 designates a drain electrode; 13 designates a diffusion region; 14 designates a line for connection between respective electrodes, between an electrode and a diffusion region, or between diffusion regions; and 15 designates a contact hole for connection between the lines 14 and the electrodes or diffusion regions. Elements of FIG. 11 corresponding to those of FIG. 10 are designated by the same reference numerals and characters. The resistors R1 and R2 provide desired resistances by in-series connection of the plurality of diffusion regions 13 formed in the fabricating step of PMOS or NMOS transistors.

The operation of the start-up circuit 3 will be discussed below. The power-supply potential $V_{DD}$ is equal to the ground potential GND before the power supply is put to work. Thus a node 5 at the connection between the drain of the PMOS Q1 and the first end of the resistor R1 is at the ground potential GND when the power is applied.

The PMOS Q1, which operates in the same manner as a diode connected in the forward direction, begins to cause an ON-current to flow from the source toward the drain at the time when the power-supply potential $V_{DD}$ rising from the ground potential GND by the application of the power exceeds the threshold voltage of the PMOS Q1. This current flowing entirely to the ground potential GND through the resistor R1 generates a voltage across the resistor R1. Thus, the potential at the node 5 rises as the current increases or the power-supply potential $V_{DD}$ rises.

There is no current flow from the resistor R2 to the bias supply circuit 4 when the bias supply circuit 4 is not in operation, since the PMOS Q2 has the source connected to the power-supply potential point 1 through the resistor R2. Thus the source potential of the PMOS Q2 rises as the power-supply potential $V_{DD}$ rises. When the difference between the potential at the node 5 and the rising source potential of the PMOS Q2 exceeds the threshold voltage of the PMOS Q2, a drain current begins to flow.

If the gate potentials of the NMOSs Q5, Q6 of the bias supply circuit 4 rise as the PMOS Q2 turns on, the bias supply circuit 4 is started. As the bias supply circuit 4 is started, a current begins to flow through the resistor R2 to cause a voltage drop in the resistor R2. Then the source potential of the PMOS Q2 falls. As the potential at the node 5 rises, the PMOS Q2 turns off.

When the power-supply potential $V_{DD}$ falls instantaneously, for example, when the bias supply circuit 4 becomes inoperative, there is no current flow in the resistor R2 and the source potential of the PMOS Q2 becomes equal to the power-supply potential $V_{DD}$. Then the gate-source voltage of the PMOS Q2 is higher than the threshold voltage of the PMOS Q2, and the drain current begins to flow in the PMOS Q2, whereby the bias supply circuit 4 is started.

FIG. 12 illustrates a bias supply circuit having a current supply direction different from that of the bias supply circuit of FIG. 10, and a start-up circuit corresponding thereto. In FIG. 12, reference character Q60 designates an NMOS transistor having a source connected to the ground potential point 2; R10 designates a diffused resistor having a first end connected to the power-supply potential point 1 and a second end connected to the drain and gate of the NMOS transistor Q60; R11 designates a diffused resistor having a first end connected to the ground potential point 2 and a second end connected to the bias supply circuit 4a; and Q61 designates an NMOS transistor having a gate connected to the second end of the resistor R10, a source connected to the second end of the resistor R11, and a drain connected to the bias supply circuit 4a.

The circuit enclosed by the dashed line indicated by reference character 3x is the start-up circuit. The bias supply circuit started by the start-up circuit 3x is enclosed by the dashed line indicated by the reference character 4a. The NMOS transistor Q61 switches on/off in response to a voltage generated between the second end of the resistor R10 and the second end of the resistor R11.

The bias supply circuit 4a includes a resistor R6, NMOS transistors Q19, Q20, and PMOS transistors Q21 to Q23. A first end of the resistor R6 and the source of the NMOS Q20 are connected to the second end of the resistor R11. The NMOS Q19 has a source connected to a second end of the resistor R6, a drain connected to the drain of the PMOS Q21, and a gate connected to the gate and drain of the PMOS Q20.

The PMOS Q22 has a drain connected to the drain of the NMOS Q20, and a gate connected to the gate and drain of the PMOS Q21. The sources of the PMOSs Q21 and Q22 are connected to the power-supply potential point 1. The PMOS Q23 has a gate connected to the gate of the PMOS Q21, a source connected to the power-supply potential point 1, and a drain through which a DC current is supplied.

In operation, as the potential at a node 18 rises up to not less than a threshold voltage $V_{TH}$ of the NMOS transistor Q60 immediately after the power supply is put to work, a drain current of the NMOS transistor Q60 flows through the diffused resistor R10. At this time, the potential at the node 18 is clamped at the threshold voltage $V_{TH}$ of the NMOS transistor Q60, and the current value equals $(V_{CC}-V_{TH})$ divided by the resistance of the diffused resistor R10. The source of the NMOS transistor Q61 is at the GND potential since there is no current flow in the diffused resistor R11. The NMOS transistor Q61 turns on since the potential at the node 18 is clamped at the threshold voltage $V_{TH}$ of the NMOS transistor Q60. Thus, the gate potentials of the PMOS transistors Q21 and Q22 fall, and a drain current of the PMOS transistor Q21 flows. This current causes a voltage drop in the diffused resistor R11, and the source potential of the NMOS transistor Q61 falls until the NMOS transistor Q61 turns off. Then the start-up circuit 3x turns off. The bias supply circuit 4a has already been stabilized in the ON-state, and thus the PMOS transistor Q23 operates as a constant current source.

The start-up circuit of FIG. 12, in which a voltage $(V_{CC}-V_{TH})$ is constantly applied across the diffused resistor R10, requires a high resistance of the diffused resistor R10 to reduce the current. The diffused resistor R11 also needs a high resistance, depending upon the constant current value of the supply circuit. This results in a very large layout area.

In the conventional start-up circuit as above described, the gate-source voltage $V_{GS}$ of the PMOS Q2 must be lower than the threshold voltage $V_{TH}$ thereof in order to turn off the PMOS Q2 in the steady state in which the bias supply circuit 4 is started. This necessitates a high potential at the node 5, resulting in a large pattern layout area for fabricating the resistor R1 simultaneously with the fabricating process of the PMOSs Q1 to Q4 and NMOSs Q5 to Q7.

Additional process of producing high resistances for reduction of the pattern layout area of the resistor R1 creates a need for more masks and more wafer process steps, resulting in increased fabricating costs.

SUMMARY OF THE INVENTION

The present invention is directed to a start-up circuit formed in a semiconductor integrated circuit and connected to first and second power-supply potentials and to a circuit-to-be-started conducting a current between the first and second power-supply potentials when started for starting the circuit-to-be-started. According to the present invention, the start-up circuit comprises: at least one insulated gate transistor having a gate connected to the first or second power-supply potential, and a drain or source connected to the second power-supply potential; diode means connected in series with the insulated gate transistor in the forward direction between the first power-supply potential and the insulated gate transistor and having an anode and a cathode for generating a predetermined voltage drop between the anode and the cathode when it is on, the diode means being producible by the process step of fabricating the insulated gate transistor; voltage drop means having a first end connected to the first or second power-supply potential and a second end connected to the circuit-to-be-started and having a predetermined resistance between the first end and the second end for causing the current between the first and second power-supply potentials to flow in the circuit-to-be-started when started, the voltage drop means being producible by the process step of fabricating the insulated gate transistor; and switching means having an input terminal connected to the second end of the voltage drop means, an output terminal connected to the circuit-to-be-started, and a control terminal connected to the cathode of the diode means for accomplishing connection/disconnection between the input terminal and the output terminal in accordance with a potential difference between the control terminal and the input terminal, the switching means being producible by the process step of fabricating the insulated gate transistor.

Since the potential difference between the first power-supply potential and the second power-supply potential varies from 0 V to the rated voltage when the semiconductor integrated circuit is in operation by putting the power supply to work, the insulated gate transistor of the present invention is adapted to be connected to the first or second power-supply potential to turn on when the potential difference between the first power-supply potential and the second power-supply potential exceeds the threshold voltage of the insulated gate transistor and such that the ON-resistance thereof is sufficiently higher than the ON-resistance of the diode means. This enables the cathode potential of the diode means when it is on to differ from the first or second power-supply potential by the amount of a potential difference corresponding to the predetermined voltage drop.

There is no current flow in the circuit-to-be-started through the voltage drop means when the circuit-to-be-started is not in operation. The potential at the second end of the voltage drop means is thus permitted to be approximately equal to the first or second power-supply potential.

The potential difference corresponding to the predetermined voltage drop generated by the diode means is generated between the control terminal and input terminal of the switching means to bring the switching means into the connected state. This enables the current supply to the circuit-to-be-started through the switching means.

As the current begins to flow through the voltage drop means by the start of the circuit-to-be-started resulting from the connection of the switching means, the voltage drop generated in the voltage drop means reduces the potential difference between the input terminal and control terminal thereof to bring the switching means into the disconnected state.

The insulated gate transistor, the diode means, the voltage drop means, and the switching means may be formed at the same time by the fabricating process of the insulated gate transistor.

As above described, the start-up circuit of the present invention is formed with the at least one insulated gate transistor having its gate connected to the first or second power-supply potential and its drain or source connected to the second power-supply potential. The diode means, the voltage drop means, and the switching means are producible by the fabricating process of the insulated gate transistor. This provides the start-up circuit which is easy to fabricate and small in pattern layout area.

Preferably, the diode means includes a second insulated gate transistor having a source connected to the first power-supply potential, and a gate and drain connected to the control terminal of the switching means.

Thus, the diode means is readily formed in the same fabricating step as that of the insulated gate transistor, providing the start-up circuit having the small pattern layout area without difficulty.

Preferably, the voltage drop means includes a diffused resistor having a first end connected to the first or second power-supply potential and a second end connected to the circuit-to-be-started, and having a predetermined resistance between the first end and the second end.

Thus, the voltage drop means having the predetermined resistance is readily formed in the same fabricating step as that of the insulated gate transistor, providing the start-up circuit having the small pattern layout area without difficulty.

According to a second aspect of the present invention, the start-up circuit comprises: at least one insulated gate transistor having a gate connected to the first or second power-supply potential, and a drain or source connected to the second power-supply potential; diode means connected in series with the insulated gate transistor in the forward direction between the first power-supply potential and the insulated gate transistor and having an anode and a cathode for generating a predetermined voltage drop between the anode and the cathode when it is on, the diode means being producible by the process step of fabricating the insulated gate transistor; an inverter having an input connected to the cathode of the diode means and an output for outputting the first power-supply potential when the potential at the input is closer to the second power-supply potential than to a predetermined potential and outputting the second power-supply potential when the potential at the input is closer to the first power-supply potential than to the predetermined potential, the inverter being producible by the process step of fabricating the insulated gate transistor; voltage drop means having a first end connected to the first or second power-supply potential and a second end connected to the circuit-to-be-started and having a predetermined resistance between the first end and the second end for causing the current between the first and second power-supply potentials to flow in the circuit-to-be-started when started, the voltage drop means being producible by the process step of fabricating the insulated gate transistor; and switching means having an input terminal connected to the second end of the voltage drop means, an output terminal connected to the circuit-to-be-started, and a control terminal connected to the output of the inverter for accomplishing connection/disconnection between the input terminal and the output terminal in accordance with a potential difference between the control terminal and the input terminal, the switching means being producible by the process step of fabricating the insulated gate transistor.

Since the potential difference between the first power-supply potential and the second power-supply potential varies from 0 V to the rated voltage when the semiconductor integrated circuit is in operation by putting the power supply to work, the insulated gate transistor of the second aspect of the present invention is adapted to be connected to the first or second power-supply potential to turn on when the potential difference between the first power-supply potential and the second power-supply potential exceeds the threshold voltage of the insulated gate transistor and such that the ON-resistance thereof is sufficiently higher than the ON-resistance of the diode means. This enables the cathode potential of the diode means when it is on to differ from the first or second power-supply potential by the amount of a potential difference corresponding to the predetermined voltage drop.

The circuit-to-be-started is often not in operation when the potential at the cathode of the diode means is closer to the second power-supply potential than the predetermined potential. Then the inverter outputs the first power-supply potential and, accordingly, the potential difference between the control terminal and input terminal of the switching means brings the switching means into the connected state. This enables the current supply to the circuit-to-be-started through the switching means.

When the potential at the cathode of the diode means is closer to the first power-supply potential than the predetermined potential, the output of the inverter is at the second power-supply potential and the switching means is brought into the disconnected state.

The insulated gate transistor, the diode means, the inverter, the voltage drop means, and the switching means may be formed at the same time by the fabricating process of the insulated gate transistor.

As above described, the start-up circuit of the second aspect of the present invention is formed with the at least one insulated gate transistor having its gate connected to the first or second power-supply potential and its drain or source connected to the second power-supply potential. The diode means, the inverter, the voltage drop means, and the switching means are producible by the fabricating process of the insulated gate transistor. This provides the start-up circuit which is easy to fabricate and small in pattern layout area.

Preferably, the diode means includes a second insulated gate transistor having a source connected to the first power-supply potential, and a gate and drain connected to the control terminal of the switching means.

Thus, the diode means is readily formed in the same fabricating step as that of the insulated gate transistor, providing the start-up circuit having the small pattern layout area without difficulty.

Preferably, the voltage drop means includes a diffused resistor having a first end connected to the first power-supply potential and a second end connected to the circuit-to-be-started and having the predetermined resistance between the first end and the second end.

Thus, the voltage drop means having the predetermined resistance is readily formed in the same fabricating step as that of the insulated gate transistor, providing the start-up circuit having the small pattern layout area without difficulty.

According to a third aspect of the present invention, the start-up circuit comprises: a plurality of insulated gate transistors having a gate connected commonly to the first or second power-supply potential, a source and a drain and connected in series between the second power-supply potential and a node; diode means connected in series with the plurality of insulated gate transistors in the forward direction between the first power-supply potential and the node and having an anode and a cathode for generating a predetermined voltage drop between the anode and the cathode when it is on; voltage drop means having a first end connected to the first or second power-supply potential and a second end connected to the circuit-to-be-started and having a predetermined resistance between the first end and the second end for causing the current between the first and second power-supply potentials to flow in the circuit-to-be-started when started; and switching means having an input terminal connected to the second end of the voltage drop means, an output terminal connected to the circuit-to-be-started, and a control terminal connected to the node for accomplishing connection/disconnection between the input terminal and the output terminal in accordance with a potential difference between the control terminal and the input terminal.

Since the first power-supply potential varies between the second power-supply potential and the normal first power-supply potential when the semiconductor integrated circuit is in operation by putting the power supply to work, the plurality of insulated gate transistors of the third aspect of the present invention are adapted in such a manner as to have the gate commonly connected to the first or second power-supply potential and be connected in series between the first and second power-supply potentials to turn on when the potential difference between the first power-supply potential and the second power-supply potential exceeds the threshold voltage of the insulated gate transistor and such that the ON-resistance thereof is sufficiently higher than the ON-resistance of the diode means. This enables the cathode potential of the diode means when it is on to differ from the first or second power-supply potential by the amount of a potential difference corresponding to the predetermined voltage drop.

There is no current flow in the circuit-to-be-started through the voltage drop means. The potential at the second end of the voltage drop means is thus permitted to be approximately equal to the first or second power-supply potential when the bias supply circuit is not in operation.

The potential difference corresponding to the predetermined voltage drop generated by the diode means is generated between the control terminal and input terminal of the switching means to bring the switching means into the connected state. This enables the current supply to the circuit-to-be-started through the switching means.

As the current begins to flow through the voltage drop means by the start of the circuit-to-be-started resulting from the connection of the switching means, the voltage drop generated in the voltage drop means reduces the potential difference between the input terminal and control terminal thereof to bring the switching means into the disconnected state.

The plurality of insulated gate transistors connected in series provides for the decrease of the gate-source voltage, and the total resistance thereof is enabled to be higher than that of the single insulated gate transistor having the same area.

According to a fourth aspect of the present invention, the start-up circuit comprises: a plurality of insulated gate transistors having a gate connected commonly to the first or second power-supply potential, a source and a drain and connected in series between the second power-supply potential and a node; diode means connected in series with the plurality of insulated gate transistors in the forward direction between the first power-supply potential and the node and having an anode and a cathode for generating a predetermined voltage drop between the anode and the cathode when it is on; an inverter having an input connected to the node and an output for outputting the first power-supply potential when the potential at the input is closer to the second power-supply potential than to a predetermined potential and outputting the second power-supply potential when the potential at the input is closer to the first power-supply potential than to the predetermined potential; voltage drop means having a first end connected to the first or second power-supply potential and a second end connected to the circuit-to-be-started and having a predetermined resistance between the first end and the second end for causing the current between the first and second power-supply potentials to flow in the circuit-to-be-started when started; and switching means having an input terminal connected to the second end of the voltage drop means, an output terminal connected to the circuit-to-be-started, and a control terminal connected to the output of the inverter for accomplishing connection/disconnection between the input terminal and the output terminal in accordance with a potential difference between the control terminal and the input terminal.

Since the potential difference between the first power-supply potential and the second power-supply potential varies from 0 V to the rated voltage when the semiconductor integrated circuit is in operation by putting the power supply to work, the insulated gate transistors of the fourth aspect of the present invention are adapted to be connected to the first or second power-supply potential to turn on when the potential difference between the first power-supply potential and the second power-supply potential exceeds the threshold voltage of the insulated gate transistors and such that the ON-resistance thereof is sufficiently higher than the ON-resistance of the diode means. This enables the cathode potential of the diode means when it is on to differ from the first or second power-supply potential by the amount of a potential difference corresponding to the predetermined voltage drop.

The circuit-to-be-started is often not in operation when the potential at the cathode of the diode means is closer to the second power-supply potential than the predetermined potential. Then the inverter outputs the first power-supply potential and, accordingly, the potential difference between the control terminal and input terminal of the switching means brings the switching means into the connected state. This enables the current supply to the circuit-to-be-started through the switching means.

When the potential at the cathode of the diode means is closer to the first power-supply potential than the predetermined potential, the output of the inverter is at the second power-supply potential and the switching means is brought into the disconnected state.

The plurality of insulated gate transistors connected in series provides for the decrease of the gate-source voltage, and the total resistance thereof is enabled to be higher than the single insulated gate transistor having the same area.

As above described, the start-up circuit of the third and fourth aspects of the present invention is formed with the plurality of insulated gate transistors having their gates commonly connected to the first or second power-supply potential, their sources and their drains and connected in series between the first power-supply potential and the second power-supply potential. This provides the start-up circuit which is very small in pattern layout area.

According to a fifth aspect of the present invention, the start-up circuit comprises: voltage drop means having a first end connected to the first power-supply potential and a second end; first switching means having a first end connected to the second end of the voltage drop means, a second end connected to the second power-supply potential, and a control terminal connected to the circuit-to-be-started, the first switching means having a relatively high resistance between the first and second ends when the circuit-to-be-started is not started and having a relatively low resistance therebetween when the circuit-to-be-started is started; an inverter having an input terminal connected to the second end of the voltage drop means and an output terminal, the inverter outputting the second power-supply potential when the potential at the input terminal is closer to the first power-supply potential than to a predetermined threshold voltage and outputting the first power-supply potential when the potential at the input terminal is closer to the second power-supply potential than to the predetermined threshold voltage; and second switching means having first and second ends connected respectively to two predetermined connecting points of the circuit-to-be-started and a control terminal connected to the output terminal of the inverter, the second switching means being conductive when the inverter outputs the first power-supply potential and being non-conductive when the inverter outputs the second power-supply potential.

The inverter of the fifth aspect of the present invention controls conduction/non-conduction of the second switching means in response to the voltage at the second end of the voltage drop means. This reduces the voltage which must be generated by the voltage drop means to be applied to the second switching means when the circuit-to-be-started is started, thereby reducing the area of the voltage drop means.

Preferably, the threshold voltage of the inverter is made closer to the first power-supply potential and the voltage drop means lowers the resistance between the first and second ends thereof so that the sum of the area of the inverter and the area of the voltage drop means is minimized within an allowable range of design conditions for the inverter and the voltage drop means.

Although the resistance between the first and second ends of the voltage drop means may be lowered by making the threshold voltage of the inverter to approach the first power-supply potential, there is an allowable range of the design conditions for the inverter and the voltage drop means. By providing a suitable relation between the threshold voltage of the inverter and the resistance of the voltage drop means within the design condition range, the sum of the area of the inverter and the area of the voltage drop means is minimized.

As above described, the start-up circuit comprises the first switching means having the first end connected to the second end of the voltage drop means, the second end connected to the second power-supply potential, and the control terminal connected to the circuit-to-be-started, the first switching means having the relatively high resistance between the first and second ends when the circuit-to-be-started is not started and having the relatively low resistance therebetween when the circuit-to-be-started is started; and the inverter having the input terminal connected to the second end of the voltage drop means and the output terminal, the inverter outputting the second power-supply potential when the potential at the input terminal is closer to the first power-supply potential than to the predetermined threshold voltage and outputting the first power-supply potential when the potential at the input terminal is closer to the second power-supply potential than to the predetermined threshold voltage. This provides a low resistance of the voltage drop means, permitting reduction in the area of the start-up circuit.

An object of the present invention is to reduce the pattern layout area of a start-up circuit without an increase in the number of fabricating steps.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
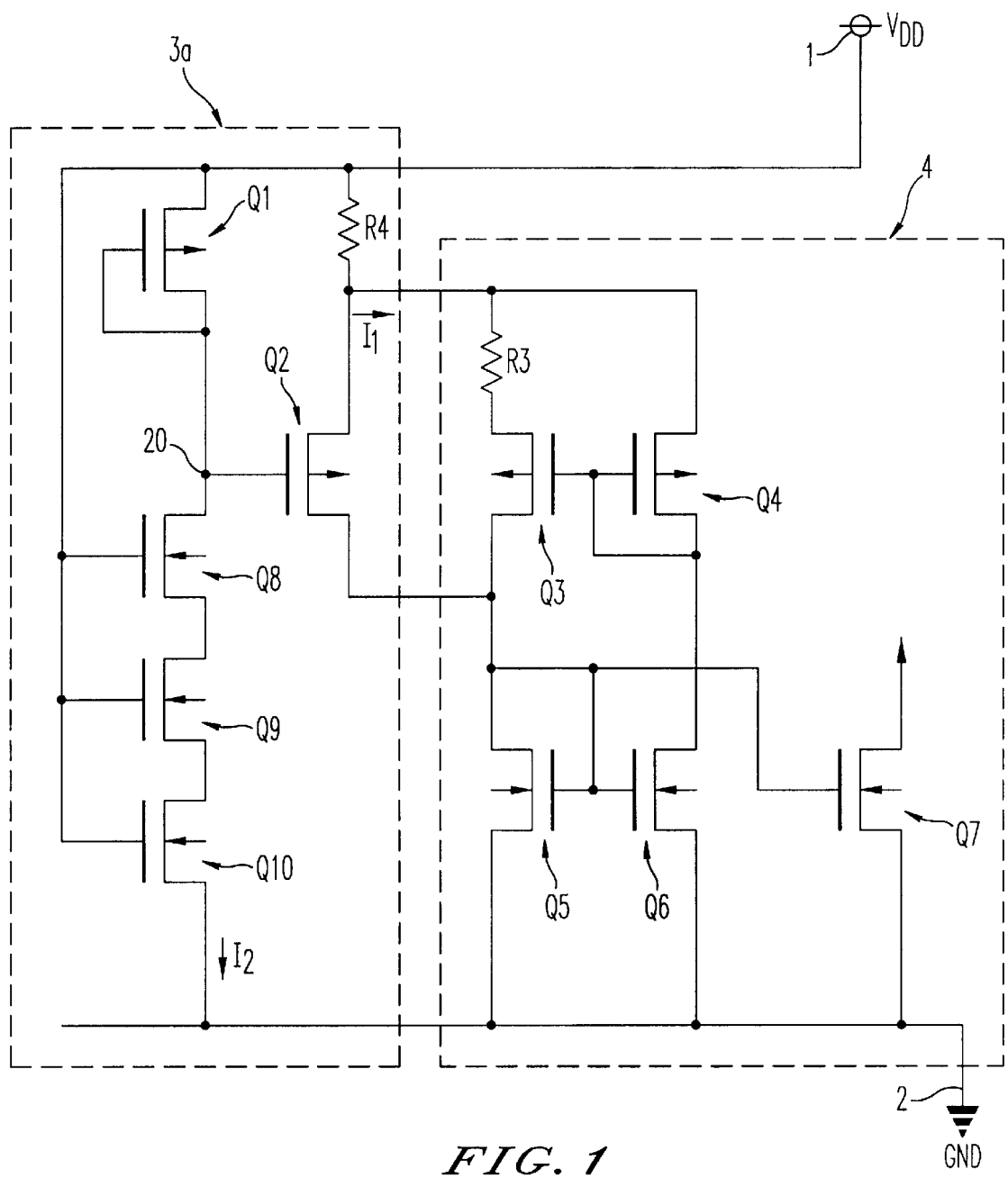
FIG. 1 is a circuit diagram for delineating a start-up circuit according to a first preferred embodiment of the present invention.
Figure 2:
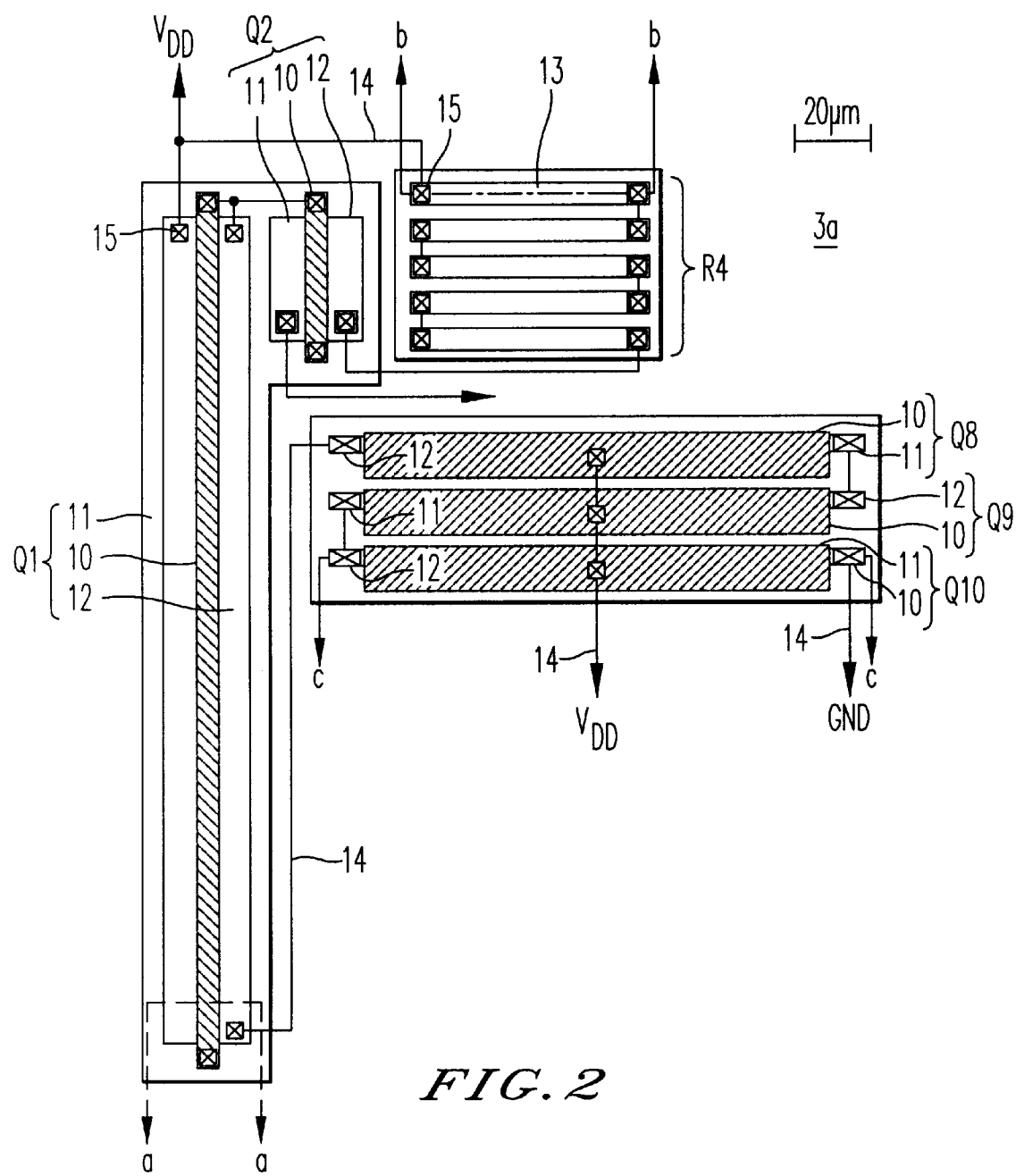
FIG. 2 shows a layout of the start-up circuit of FIG. 1.
Figure 10:
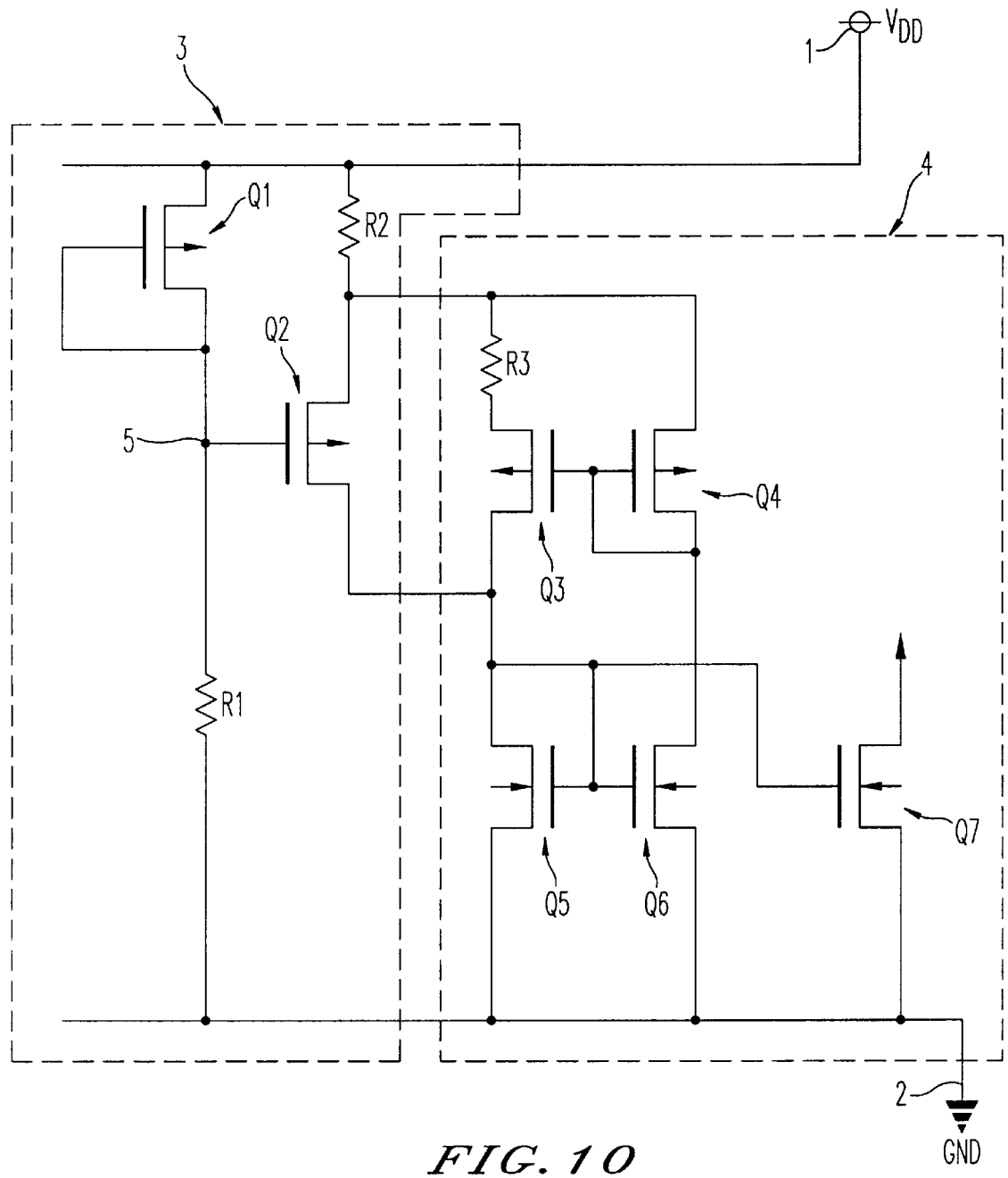
FIG. 10 is a circuit diagram for delineating a conventional start-up circuit.

Referring to FIGS. 1 and 2, description will be given hereinafter on a first preferred embodiment according to the present invention. FIG. 1 is a circuit diagram for delineating a start-up circuit including a CMOS according to the first preferred embodiment of the present invention. In FIG. 1, a circuit enclosed by the dashed line indicated by reference character 3a is the start-up circuit. A bias supply circuit 4 started by the start-up circuit 3a is similar in construction to the conventional bias supply circuit 4 of FIG. 10.

In FIG. 1, reference character Q1 designates a PMOS having a source connected to a power-supply potential point 1; R4 designates a resistor having a first end connected to the power-supply potential point 1 and a second end connected to the bias supply circuit 4; Q8 to Q10 designate NMOSs connected in series between the drain of the PMOS Q1 and a ground potential point 2 and having a gate connected to the power-supply potential point 1; and Q2 designates a PMOS having a source connected to the second end of the resistor R4 and having a drain connected to the bias supply circuit 4. The PMOS Q2 has a gate connected to the drain of the NMOS Q8 and switches on/off in response to a voltage generated between the drain of the NMOS Q8 and the second end of the resistor R4.

An exemplary design of the start-up circuit will be described below. It is assumed that a node 20 at the connection between the drain of the PMOS Q1 and the drain of the NMOS Q8 has a potential $V_{20}$. The potential $V_{20}$ at the node 20 is given by $(V_{DD}-V_{GS1})$ where $V_{GS1}$ is the gate-source voltage of the PMOS Q1 which is on.

The source potential of the PMOS Q2 is given by $(V_{DD}-r_4 \times I_1)$ where $I_1$ is a current flowing in the bias supply circuit 4 which is in operation through the resistor R4, and $r_4$ is the resistance of the resistor R4.

Therefore, the gate-source voltage $V_{GS2}$ of the PMOS Q2 is given as $(V_{DD}-r_4 \times I_1)-(V_{DD}-V_{VGS1})$. Arranging this expression provides $(V_{GS1}-r_4 \times I_1)$. The gate-source voltage $V_{GS2}$ of the PMOS Q2 is determined by the threshold voltage of the PMOS Q1 and the voltage generated across the resistor R4 independently of variation in the power-supply potential $V_{DD}$.

It is necessary that the gate-source voltage $V_{GS2}$ of the PMOS Q2 is lower than the threshold voltage $V_{TH2}$ thereof in order to turn off the PMOS Q2 when the bias supply circuit 4 operates. Thus, the condition: $V_{TH2}>V_{GS1}-r_4 \times I_1$ must be satisfied when the bias supply circuit 4 is in operation. Since $V_{TH}$ is normally 0.6 to 0.9 V, the condition is satisfied, for example if the gate-source voltage $V_{GS1}$ of the PMOS Q1 is 0.85 V and $r_4 \times I_1$ is 1 V. The total ON-resistance r of the in-series connected NMOSs Q8, Q9, Q10 is $r=(V_{DD}-V_{GS1})\div I_2=150$ kΩ if the power-supply potential $V_{DD}$ is 5 V and a current $I_2$ flowing from the PMOS Q1 through the NMOSs Q8, Q9 and Q10 is 28 µA.

For example, each of the NMOSs Q8, Q9, Q10 is required to have a resistance of 50 kΩ or more. This is achieved by a short gate length L and a gate width W which is thirty times the gate length L. Such gate length L and gate width W can be replaced with thirty sheets of resistor pattern. The use of a resistor of the same shape fabricated in the same process step as that of the MOS transistors results in about 3 kΩ, which is considerably lower than the resistance 50 kΩ of the NMOSs Q8 to Q10.

The resistance of the NMOSs Q8 to Q10 slightly changes with variation in the power-supply potential $V_{DD}$. However, the higher the power supply potential $V_{DD1}$ might be, the lower the resistance is. Thus the resistance of the NMOSs Q8 to Q10 should be set, with the power-supply potential $V_{DD}$ at its maximum.

In the start-up circuit 3a of FIG. 1, the plurality of N-channel MOS transistors are connected in series. The ON-resistance $R_{ON}$ of an MOS transistor is expressed as:

$$R_{ON} = \frac{1}{\beta\{(V_{GS} - V_{TH}) - V_{DS}\}} \quad (1)$$

where β is a transistor gain coefficient.

The gate-source voltage $V_{GS}$ of the NMOSs Q8 and Q9 is lower than that of a single N-channel MOS transistor. The ON-resistance $R_{ON}$ of a plurality of in-series connected NMOSs into which the single NMOS is divided is higher than that of the single NMOS if the both have the same total gate width. To obtain the same resistance, the plurality of in-series connected MOS transistors provide a smaller gate width and a smaller pattern layout area.

It is assumed that the PMOSs Q1 to Q4, NMOSs Q5 to Q10, and resistors R3, R4 are fabricated in the same process step. The size and characteristic values are as follows: the ratio of gate width to gate length (hereinafter referred to as W/L) of the PMOS Q1 is 200/3; W/L of the PMOS Q2 is 30/3; the resistance of the resistor R3 is 10 kΩ; the resistance of the resistor R4 is 5 kΩ; W/L of the PMOS Q3 is 540/3; W/L of the PMOS Q4 is 40/3; W/L of the NMOSs Q5 to Q7 is 10/2; and W/L of the NMOSs Q8 to Q10 is 4/120. The power-supply potential $V_{DD}$ is 5 V in normal operation.

Figure 11:
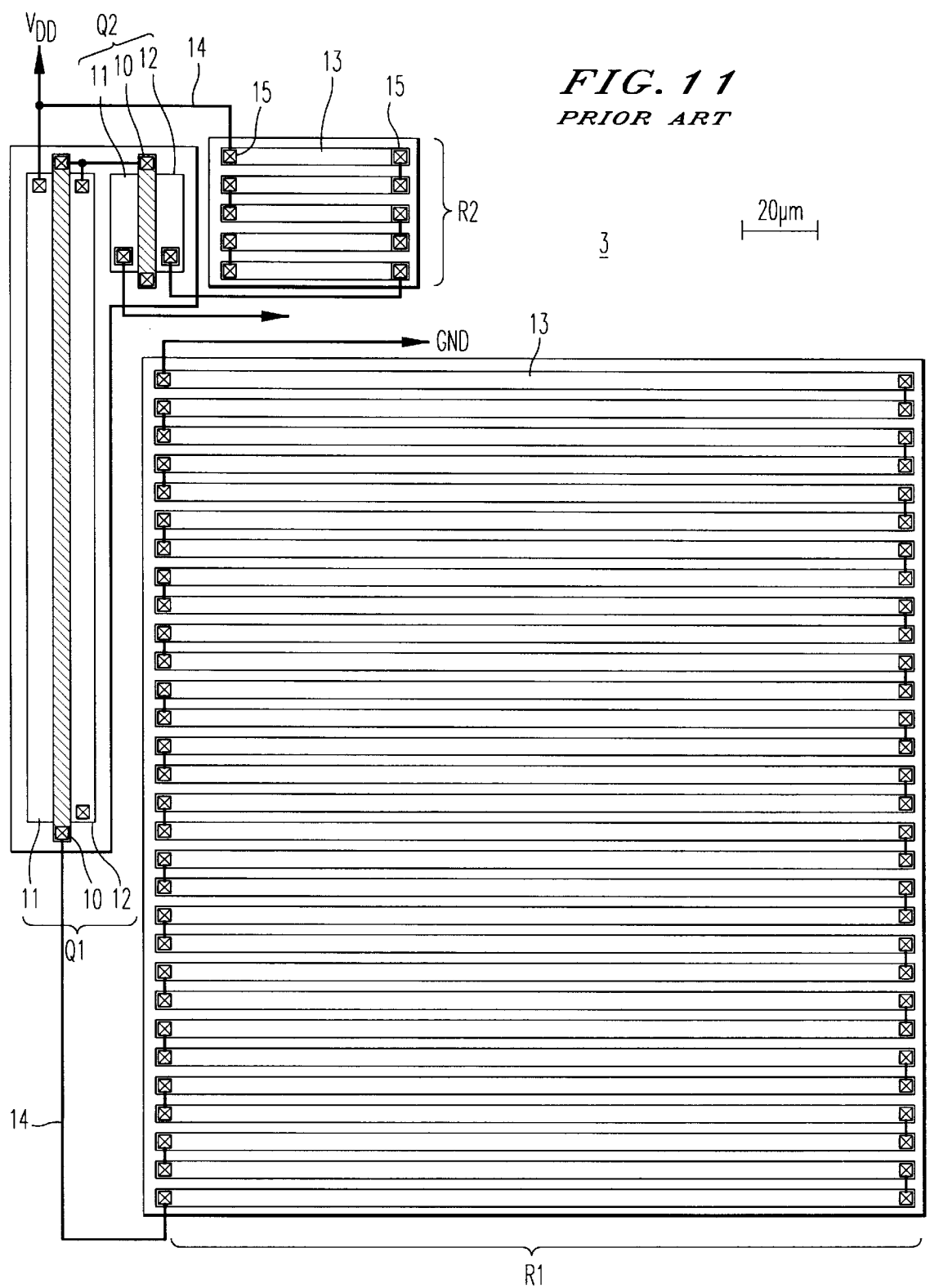
FIG. 11 shows a layout of the start-up circuit of FIG. 10.

FIG. 2 shows a layout of the start-up circuit 3a of FIG. 1 enlarged by the same magnifications as FIG. 11. In FIG. 2, reference numeral 10 designates a gate electrode; 11 designates a source electrode; 12 designates a drain electrode; 13 designates a diffusion region; 14 designates a line for connection between respective electrodes, between an electrode and a diffusion region, or between diffusion regions; and 15 designates a contact hole for connection between the lines 14 and the electrodes or diffusion regions. Elements of FIG. 2 corresponding to those of FIG. 1 are designated by the same reference numerals and characters. A resistor R2 provides a desired resistance by in-series connection of the plurality of diffusion regions 13 fabricated in the fabricating step of PMOS or NMOS transistors. Since the NMOSs Q8 to Q10 apply the gate potential of the PMOS Q2, the area of the NMOSs Q8 to Q10 is smaller than that of the conventional resistor R1 of FIG. 11 and, accordingly, the area of the start-up circuit 3a is reduced. The division into the NMOSs Q8 to Q10 improves the degree of layout freedom when they are arranged, and facilitates the layout.

The operation of the start-up circuit 3a will be discussed below. The power-supply potential $V_{DD}$ is equal to the ground potential GND before the power supply is put to work.

The power-supply potential $V_{DD}$ rises as the power is applied, and the NMOSs Q8 to Q10 turn on at the time when the potential difference between the rising power-supply potential $V_{DD}$ and the ground potential GND exceeds the threshold voltage of the NMOSs Q8 to Q10.

The PMOS Q1, which operates in the same manner as a diode connected in the forward direction, begins to cause an ON-current to flow from the source toward the drain at the time when the power-supply potential VDD rising from the ground potential GND by the application of the power causes the gate-source voltage of the PMOS Q1 to exceed the threshold voltage of the PMOS Q1. This current flowing entirely to the ground potential GND through the NMOSs Q8 to Q10 generates a voltage between the drain of the NMOS Q8 and the source of the NMOS Q10. Thus the potential at the node 20 rises as the current increases or the power-supply potential $V_{DD}$ rises.

Since the PMOS Q2 has a source connected to the power-supply potential point 1 through the resistor R4, there is no current flow from the resistor R4 to the bias supply circuit 4 when the bias supply circuit 4 is not in operation, and the source potential of the PMOS Q2 rises as the power-supply potential $V_{DD}$ rises. A drain current begins to flow when the difference between the potential at the node 20 and the rising source potential of the PMOS Q2 exceeds the threshold voltage of the PMOS Q2.

The bias supply circuit 4 is started when the gate potentials of the NMOSs Q5 and Q6 of the bias supply circuit 4 rise as the PMOS Q2 turns on. As the bias supply circuit 4 is started, a current begins to flow through the resistor R4 to cause a voltage drop in the resistor R4. Then the source potential of the PMOS Q2 falls. As the potential at the node 20 rises, the PMOS Q2 turns off.

When the power-supply potential $V_{DD}$ falls instantaneously, for example, when the bias supply circuit 4 becomes inoperative, there is no current flow in the resistor R4, and the source potential of the PMOS Q2 becomes equal to the power-supply potential $V_{DD}$ and higher than the threshold voltage of the PMOS Q2. Then the drain current begins to flow in the PMOS Q2, and the bias supply circuit 4 is started.

The process steps of fabricating the start-up circuit of FIG. 2 will be discussed below with reference to FIGS. 13A to 13C, 14A to 14C, 15A to 15C, 16A to 16C, 17A to 17C, and 18A to 18C. FIGS. 13A, 14A, 15A, 16A, 17A and 18A are cross-sectional views taken along the dashed-and-dotted line a—a of FIG. 2. FIGS. 13B, 14B, 15B, 16B, 17B and 18B are cross-sectional views taken along the dashed-and-dotted line b—b of FIG. 2. FIGS. 13C, 14C, 15C, 16C, 17C and 18C are cross-sectional views taken along the dashed-and-dotted line c—c of FIG. 2. It should be noted that these figures are conceptual views for delineating the construction, and the size of respective parts in these figures is not the same as the size of those in FIG. 2.

In FIGS. 13A to 13C, 14A to 14C, 15A to 15C, 16A to 16C, 17A to 17C, and 18A to 18C, reference numeral 50 designates a P type substrate; 51 designates an N well; 52 designates a P well; 53 designates a field oxide film; 54 designates polysilicon for forming a gate electrode of an MOS transistor; 55 designates tungsten silicide for forming the gate electrode of the MOS transistor; 56 designates an N+ diffusion layer for forming a source or drain of an NMOS transistor; 57 designates a gate insulating film of the MOS transistor; 58 designates a P+ diffusion layer for forming a source or drain of a PMOS transistor; 59 designates an oxide film for layer-to-layer insulation; and 60 designates an aluminum wiring for electrical connection to an electrode of a transistor and a terminal of a resistor.

Figure 13A:
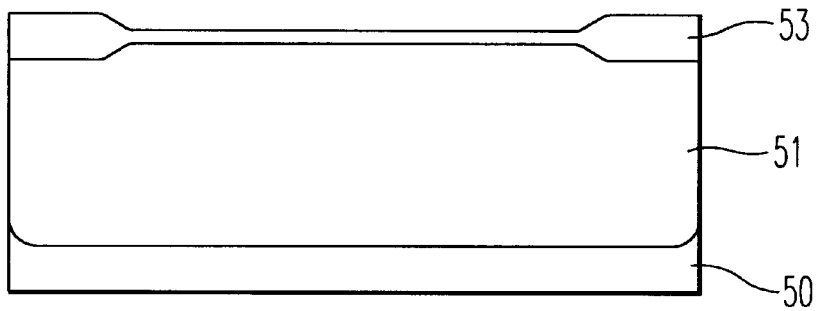
FIGS. 13A to 13C, 14A to 14C, 15A to 15C, 16A to 16C, 17A to 17C, 18A to 18C are sectional views for delineating process steps of fabricating the start-up circuit of the first preferred embodiment.
Figure 13B:
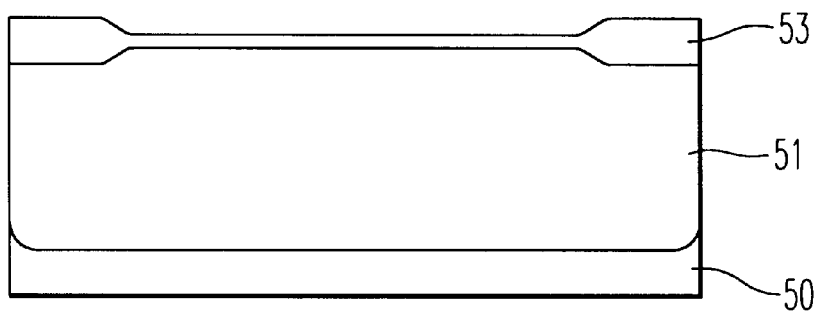
Figure 13C:
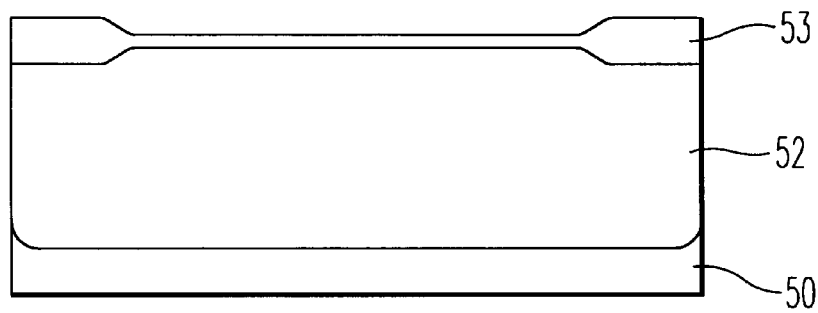

The process steps of fabrication will be described below in order. Initially, an epitaxial layer is formed on the P substrate 50 and is then implanted with impurities to form the N well 51 and P well 52 for element formation. FIGS. 13A, 13B, 13C show the field oxide film 53 formed for element isolation.

Figure 14A:
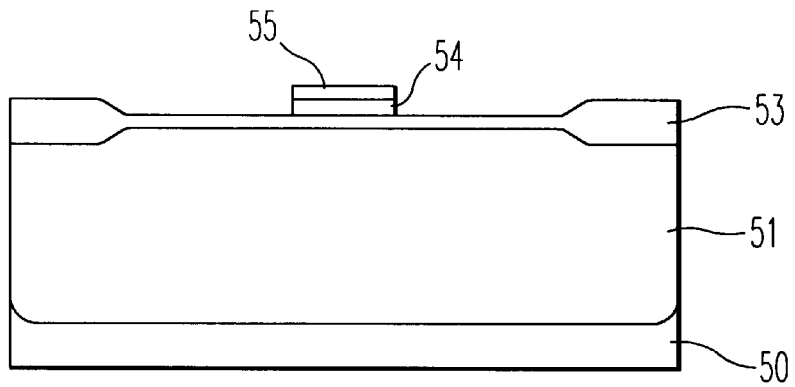
Figure 14B:
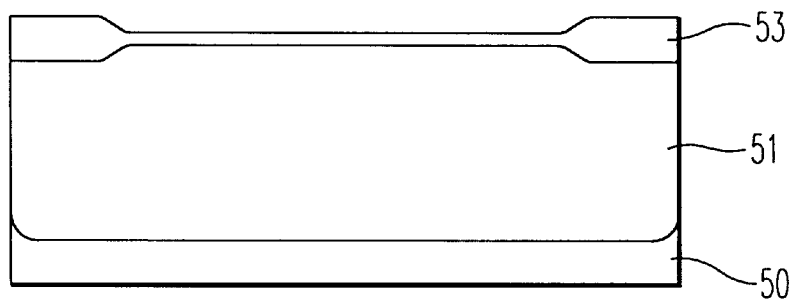
Figure 14C:
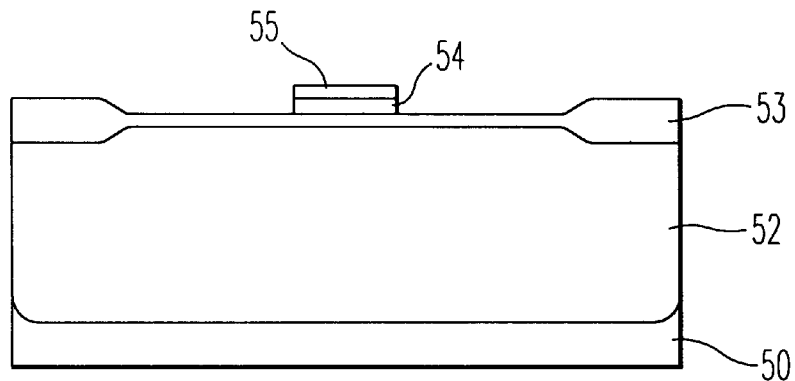
Figure 15A:
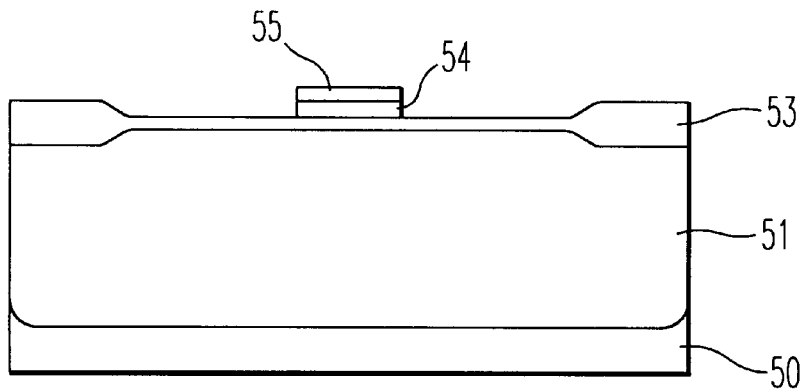
Figure 15B:
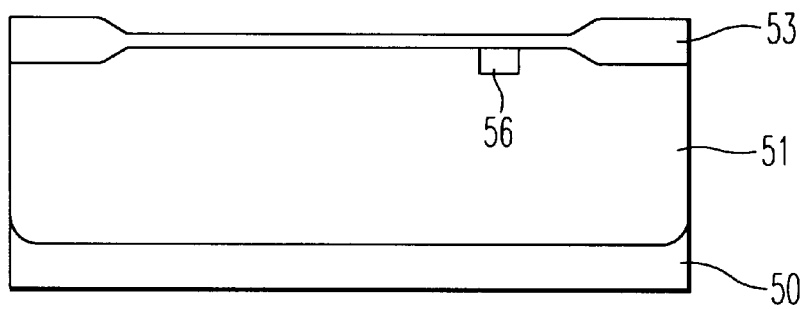
Figure 15C:
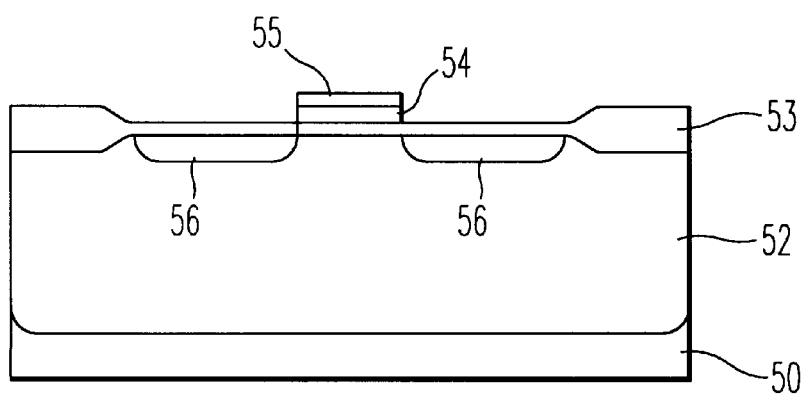
Figure 16A:
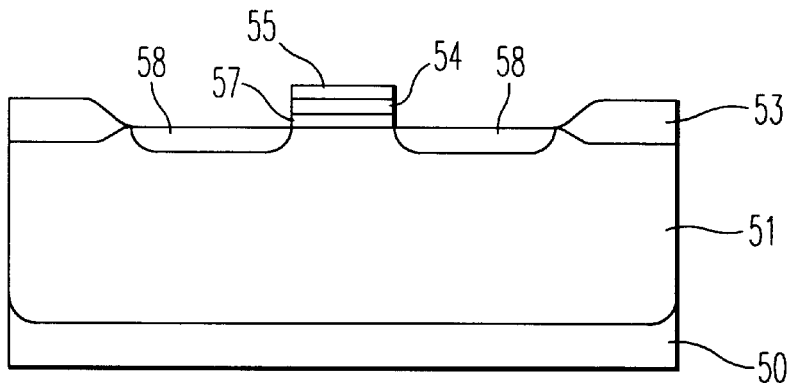
Figure 16B:
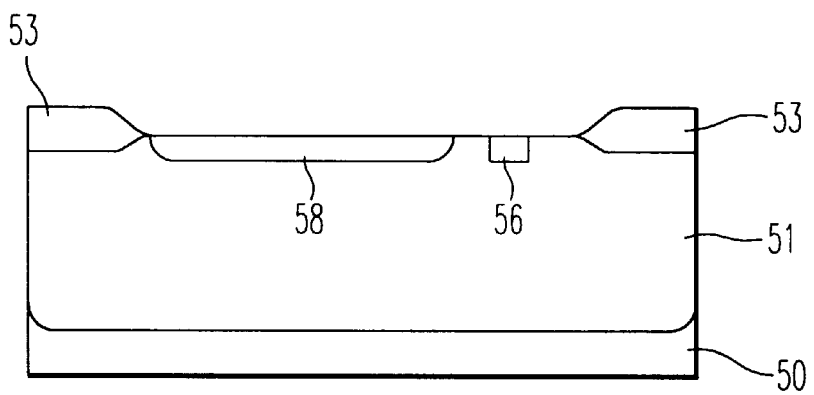
Figure 16C:
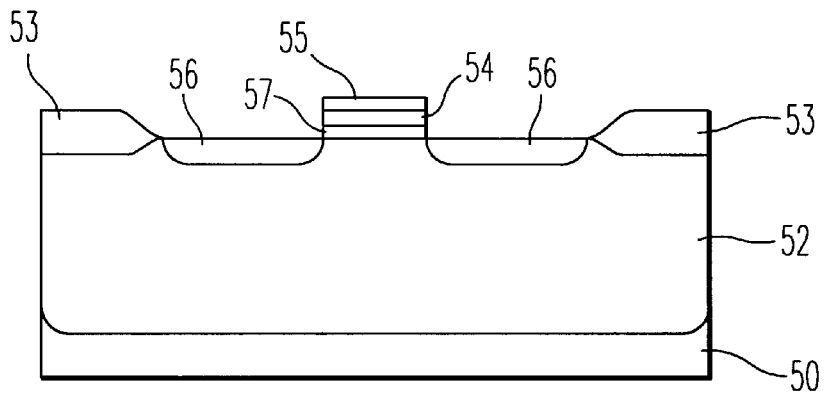

The polysilicon 54 and the tungsten silicide 55 for forming the gate electrode of the MOS transistor are formed on the oxide film (FIGS. 14A, 14B, 14C). A mask is formed, and impurities are implanted using the layered polysilicon 54 and tungsten silicide 55 and the field oxide film 53 as a mask, to form the N+ diffusion layer 56 for formation of the source and drain of the NMOS transistor (FIGS. 15A, 15B, 15C). At this time, the N+ diffusion layer 56 is also formed in the N well 51 for formation of a diffused resistor, as shown in FIG. 15B. Likewise, a predetermined mask is formed, and impurities are implanted using the layered polysilicon 54 and tungsten silicide 55 and the field oxide film 53 as a mask, to form the P+ diffusion layer 58 for formation of the source and drain of the PMOS transistor. Then the oxide film on the N+ diffusion layer 56 and the P+ diffusion layer 58 is removed (FIGS. 16A, 16B, 16C).

Figure 17A:
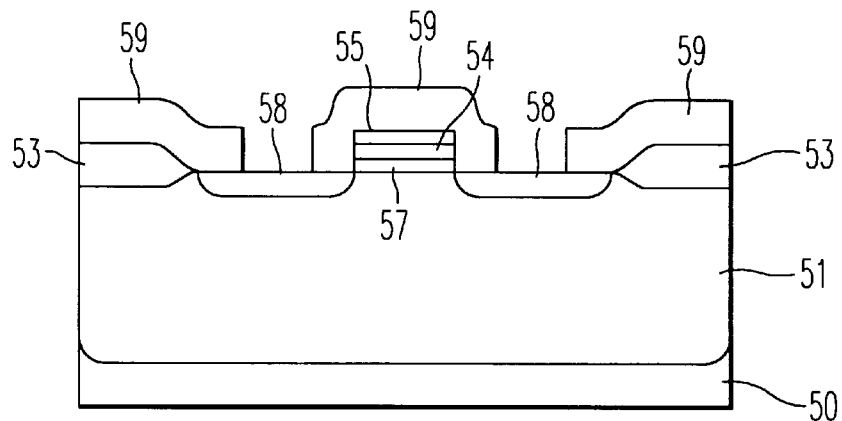
Figure 17B:
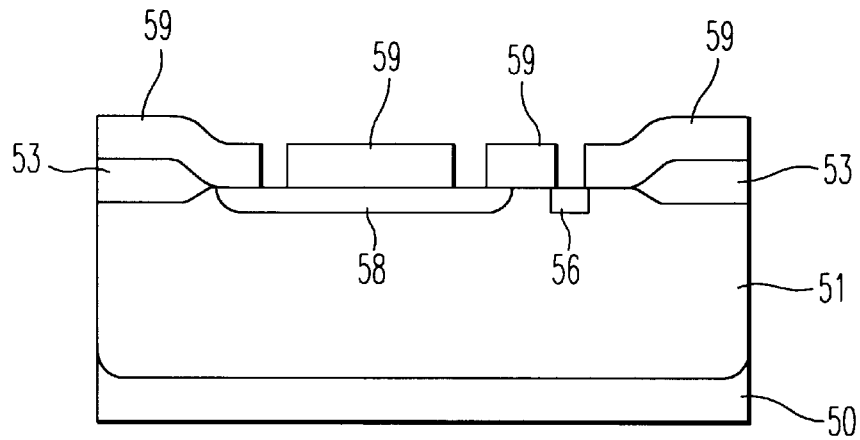
Figure 17C:
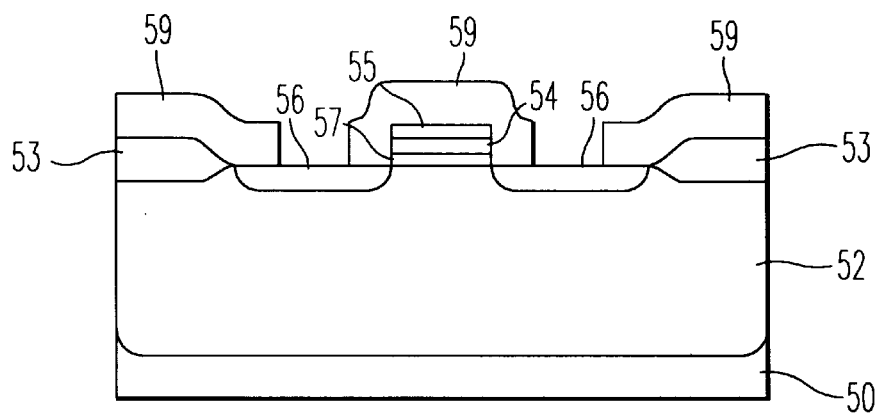
Figure 18A:
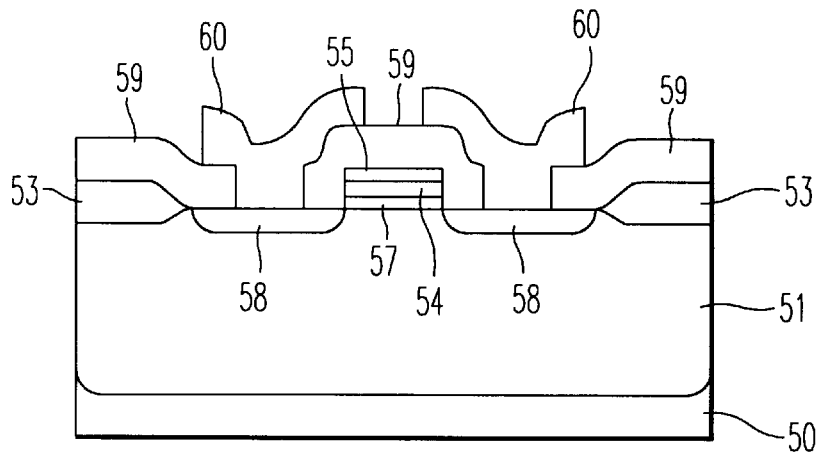
Figure 18B:
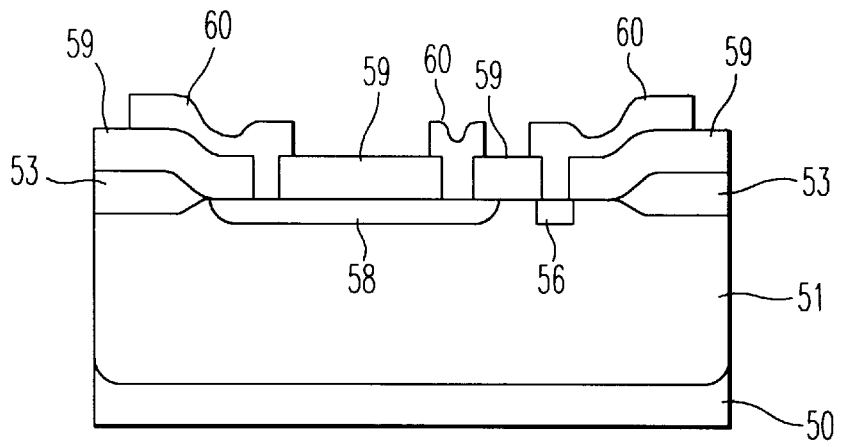
Figure 18C:
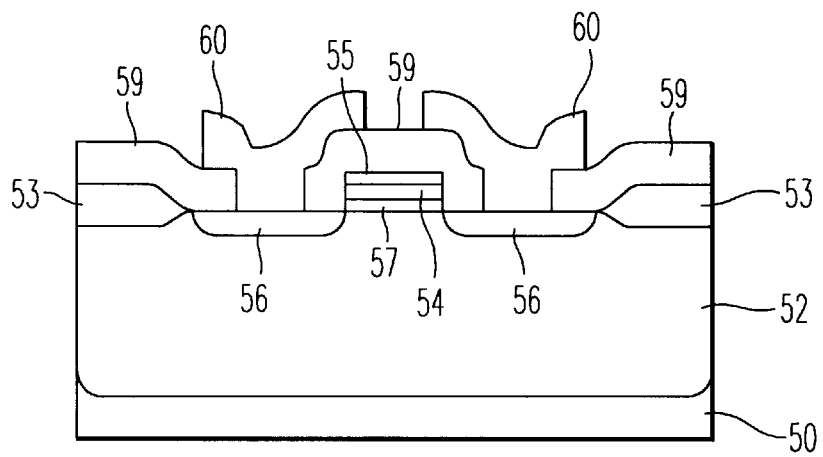

The layer-to-layer insulating oxide film 59 for formation of a wiring layer is formed over the top surface except in portions required to contact on the N+ diffusion layer 56 and the P+ diffusion layer 58 (FIGS. 17A, 17B, 17C). Then the aluminum wiring 60 is formed for electrical connection to the respective elements (FIGS. 18A, 18B, 18C).

In this manner, the diffused resistor R4 is formed during the process step of fabricating the PMOS transistor Q1 and NMOS transistors Q8 to Q10 shown in FIG. 2. The diffused resistors R3 and R4 are formed during the process step of fabricating the MOS transistors Q1 to Q10 shown in FIG. 1.

Although the NMOSs Q8 to Q10 are enhancement type MOSFETs in the first preferred embodiment, depletion type MOSFETs may be used which provide the same effects as the first preferred embodiment.

Figure 3:
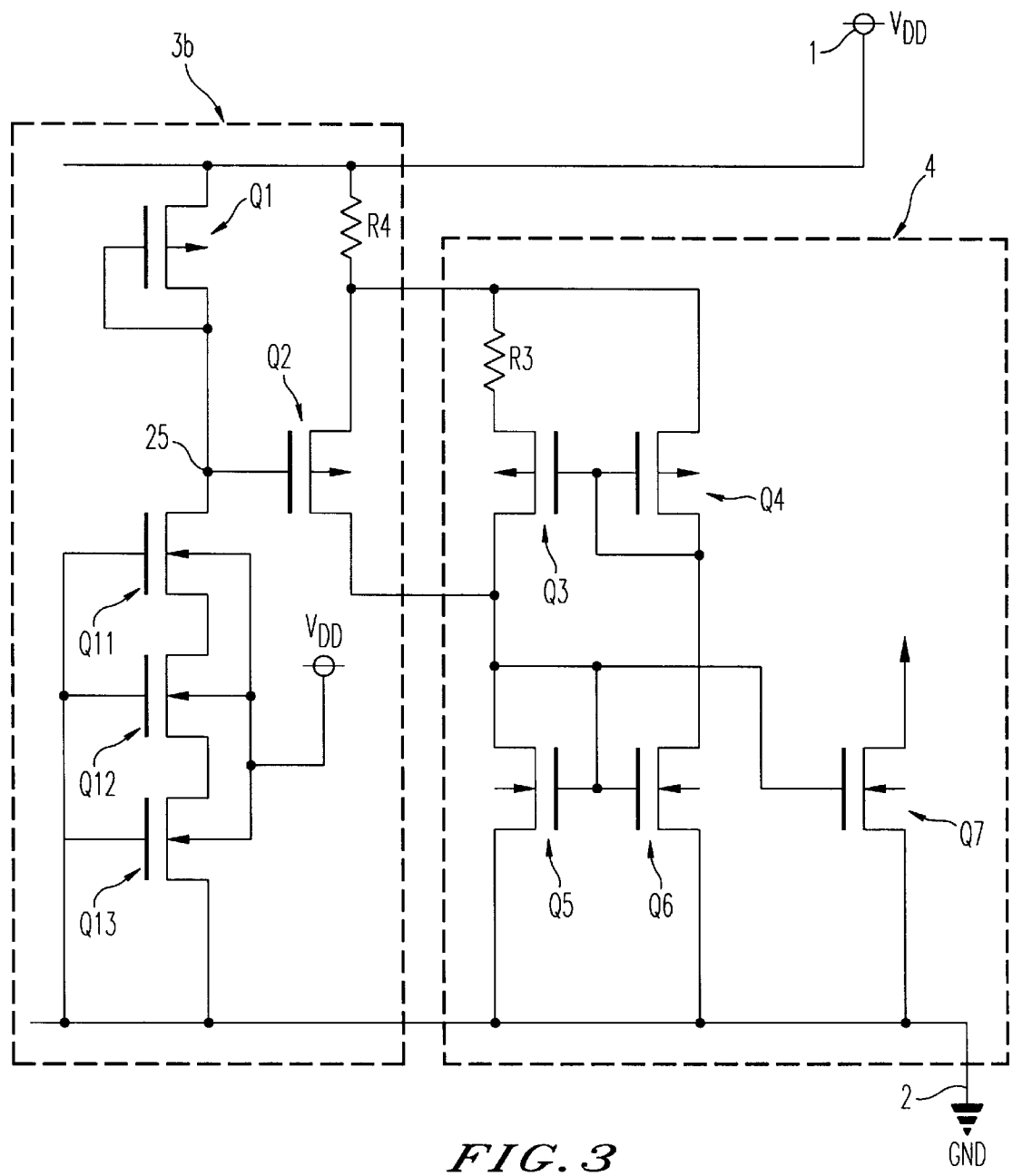
FIG. 3 is a circuit diagram for delineating the start-up circuit according to a second preferred embodiment of the present invention.

A second preferred embodiment according to the present invention will now be described with reference to FIG. 3. In FIG. 3, reference character Q1 designates a PMOS having a source connected to the power-supply potential point 1; R4 designates a resistor having a first end connected to the power-supply potential point 1 and a second end connected to the bias supply circuit 4; Q11 to Q13 designate PMOSs connected in series between the drain of the PMOS Q1 and the ground potential point 2 and having a gate connected to the ground potential point 2; and Q2 designates a PMOS connected to the second end of the resistor R4 and having a drain connected to the bias supply circuit 4. Reference numeral 25 designates a node at the connection between the drain of the PMOS Q1 and the drain of the PMOS Q11. The PMOS Q2 has a gate connected to the drain of the PMOS Q11 and switches on/off in response to a voltage generated between the drain of the PMOS Q11 and the second end of the resistor R4. The bias supply circuit 4 of the second preferred embodiment is similar in construction to the bias supply circuit 4 of the first preferred embodiment.

A start-up circuit 3b includes the PMOSs Q1, Q2, Q11 to Q13 and the resistor R4. The PMOSs Q11 to Q13 have their gates connected to the ground potential point 2 and are connected in series between the drain of the PMOS Q1 and the ground potential point 2. The start-up circuit 3b is similar in construction to the start-up circuit 3a of FIG. 1 except that the MOS transistors connected in series between the drain of the PMOS Q1 and the ground potential point 2 are P-channel MOS transistors having a gate connected to the ground potential GND.

The circuit of FIG. 3 is operative to function in the same manner as the start-up circuit 3a of FIG. 1. That is, when the PMOSs Q11 to Q13 turn on by the increase of the power-supply potential $V_{DD}$, the potential at the node 25 falls, so that the PMOS Q2 turns on. It is necessary that the resistance of the in-series connected PMOSs Q11 to Q13 are equal to that of the in-series connected NMOSs Q8 to Q10 of FIG. 1. The use of the PMOSs Q11 to Q13 allows the area to be reduced as in the first preferred embodiment.

Figure 4:
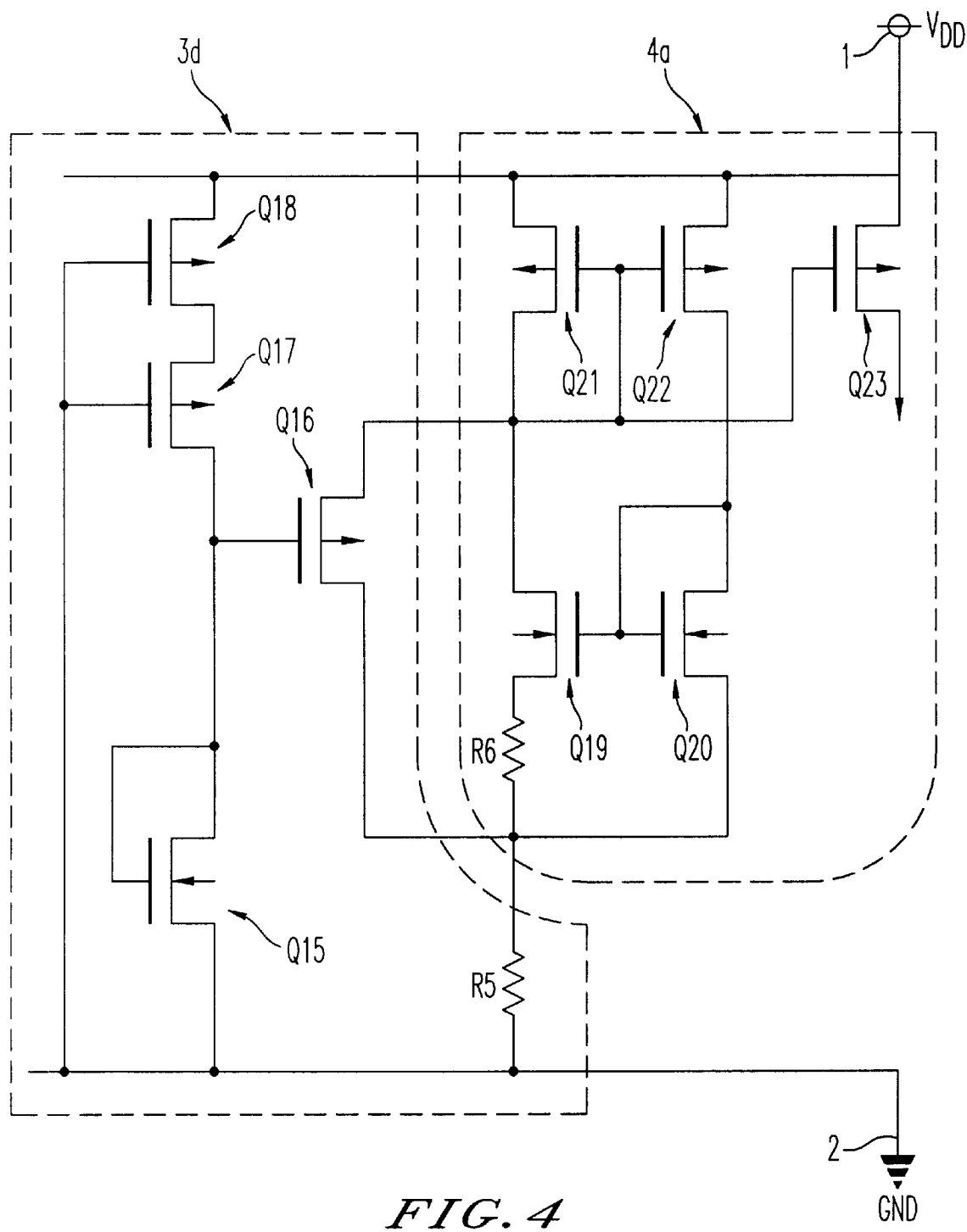
FIG. 4 is a circuit diagram for delineating the start-up circuit according to a third preferred embodiment of the present invention.

A third preferred embodiment according to the present invention will now be described with reference to FIG. 4. FIG. 4 is a circuit diagram for delineating the start-up circuit including a CMOS according to the third preferred embodiment of the present invention. In FIG. 4, reference character Q15 designates an NMOS having a source connected to the ground potential point 2; Q17 designates a PMOS having a drain connected to the drain and gate of the NMOS Q15 and a gate connected to the ground potential point 2; and Q18 designates a PMOS having a source connected to the power-supply potential point 1, a drain connected to the source of the PMOS Q17, and a gate connected to the ground potential point 2. A circuit enclosed by the dashed line indicated by reference character 3d is the start-up circuit. The bias supply circuit started by the start-up circuit 3d is enclosed by the dashed line indicated by reference character 4a.

Reference character R5 designates a resistor having a first end connected to the ground potential point 2 and a second end connected to the bias supply circuit 4a; and Q16 designates an NMOS having a source connected to the second end of the resistor R5 and a drain connected to the bias supply circuit 4a. The NMOS Q16 has a gate connected to the drain of the NMOS Q15 and switches on/off in response to a voltage generated between the second end of the resistor R5 and the drain of the NMOS Q15.

The bias supply circuit 4a includes a resistor R6, NMOSs Q19, Q20, and PMOSs Q21 to Q23.

A first end of the resistor R6 and the source of the NMOS Q20 are connected to the second end of the resistor R5. The source of the NMOS Q19 is connected to a second end of the resistor R6, and the drain of the NMOS Q19 is connected to the drain of the PMOS Q21. The gate of the NMOS Q19 is connected to the gate and drain of the NMOS Q20. The drain of the PMOS Q22 is connected to the drain of the NMOS Q20, and the gate of the PMOS Q22 is connected to the gate and drain of the PMOS Q21. The sources of the PMOSs Q21 and Q22 are connected to the power-supply potential point 1. The PMOS Q23 has a gate connected to the gate of the PMOS Q21, a source connected to the power-supply potential point 1, and a drain through which a DC current is supplied.

The operation of the start-up circuit 3d will be described below. The power-supply potential $V_{DD}$ is equal to the ground potential GND before the power supply is put to work. The power-supply potential $V_{DD}$ rises as the power is applied, and the PMOSs Q17 and Q18 turn on at the time when the potential difference between the rising power-supply potential $V_{DD}$ and the ground potential GND exceeds the threshold voltage of the PMOSs Q17 and Q18.

The NMOS Q15, which operates in the same manner as a diode connected in the forward direction, begins to cause an ON-current to flow from the source toward the drain at the time when the power-supply potential $V_{DD}$ rising from the ground potential GND by the application of the power causes the gate-source voltage of the NMOS Q15 to exceed the threshold voltage of the NMOS Q15. This current flowing entirely to the power-supply potential $V_{DD}$ through the PMOSs Q17, Q18 generates a voltage between the drain of the PMOS Q17 and the source of the PMOS Q18. However, since the ON-resistance of the PMOSs Q17 and Q18 is high as compared with that of the NMOS Q15, the potential difference across the NMOS Q15 is about the threshold voltage of the NMOS Q15 independently of the increase of the current or the rising of the power-supply potential $V_{DD}$.

Since the NMOS Q16 has the source connected to the ground potential point 2 through the resistor R5, the source potential of the NMOS Q16 is equal to the ground potential GND when the bias supply circuit 4a is not in operation. A drain current of the NMOS Q16 begins to flow when the potential difference between the node 35 and the source of the NMOS Q16 exceeds the threshold voltage of the NMOS Q16.

The bias supply circuit 4a is started when the gate potentials of the PMOSs Q21 and Q22 of the bias supply circuit 4a rise as the NMOS Q16 turns on. As the bias supply circuit 4a is started, a current begins to flow through the resistor R5 to cause a voltage drop in the resistor R5. Thus the source potential of the NMOS Q16 rises and the NMOS Q16 turns off.

When the power-supply potential $V_{DD}$ falls instantaneously, for example, when the bias supply circuit 4a becomes inoperative with the potential at the node 35 increased from 0 V by the amount of the threshold voltage of the NMOS Q15, there is no current flow in the resistor R5, and the source potential of the NMOS Q16 becomes equal to the ground potential GND. The gate-source voltage of the NMOS Q16 is then higher than the threshold voltage of the NMOS Q16. The drain current begins to flow in the NMOS Q16 and the bias supply circuit 4a is started.

Although the PMOSs Q17 and Q18 are enhancement type MOSFETs in the third preferred embodiment, depletion type MOSFETs may be used which provide the same effects as the third preferred embodiment.

Figure 5:
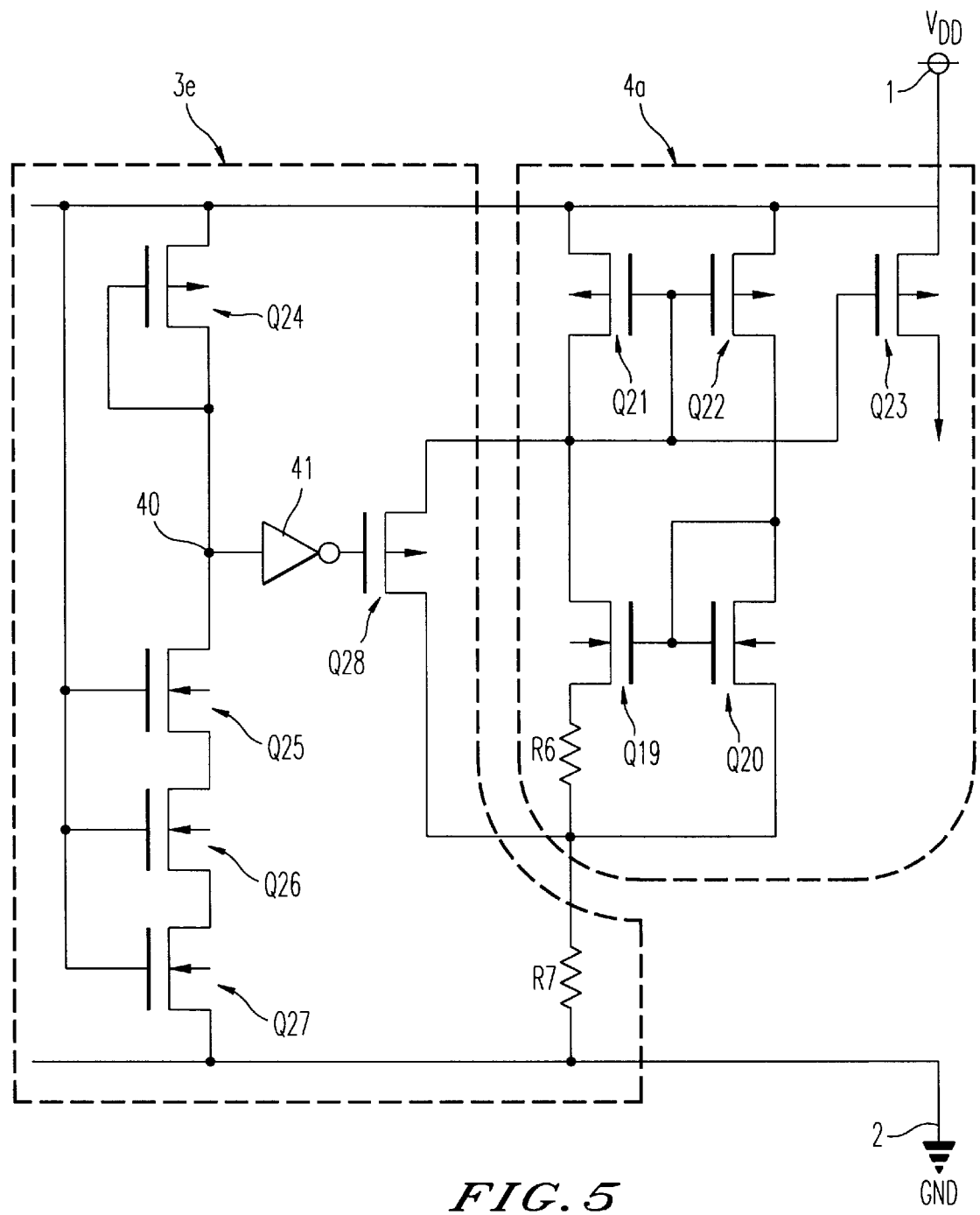
FIG. 5 is a circuit diagram for delineating the start-up circuit according to a fourth preferred embodiment of the present invention.

A fourth preferred embodiment according to the present invention will now be described with reference to FIG. 5. FIG. 5 is a circuit diagram for delineating the start-up circuit including a CMOS according to the fourth preferred embodiment of the present invention. In FIG. 5, a circuit enclosed by the dashed line indicated by reference character 3e is the start-up circuit. A bias supply circuit 4a started by the start-up circuit 3e is similar in construction to the bias supply circuit 4a of FIG. 4.

In FIG. 5, reference character Q24 designates a PMOS having a source connected to the power-supply potential point 1; R7 designates a resistor having a first end connected to the ground potential point 2 and a second end connected to the bias supply circuit 4a; Q25 to Q27 designate NMOSs connected in series between the drain of the PMOS Q24 and the ground potential point 2 and having a gate connected to the power-supply potential point 1; and Q28 designates an NMOS connected to the second end of the resistor R7 and having a drain connected to the bias supply circuit 4a. The NMOS Q28 has a gate connected to the drain of the NMOS Q25 through an inverter 41 and switches on/off in response to a voltage outputted from the inverter in accordance with the drain potential of the NMOS Q25.

Since the inverter 41 switches on/off the NMOS Q28, the on/off operation of the NMOS Q28 is insured by judging whether or not the potential at a node 40 is higher than the threshold voltage of the inverter 41. Thus the resistance of the NMOSs Q25 to Q27 should be set such that the potential at the node 40 is sufficiently higher than the threshold voltage of the inverter 41 when the power-supply potential $V_{DD}$ is the operating voltage (5 V).

Figure 8A:
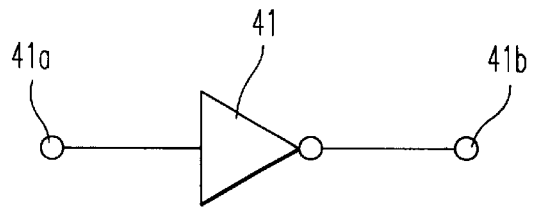
FIGS. 8A to 8D are circuit diagrams of an inverter for use in the start-up circuit of the fourth preferred embodiment.
Figure 8B:
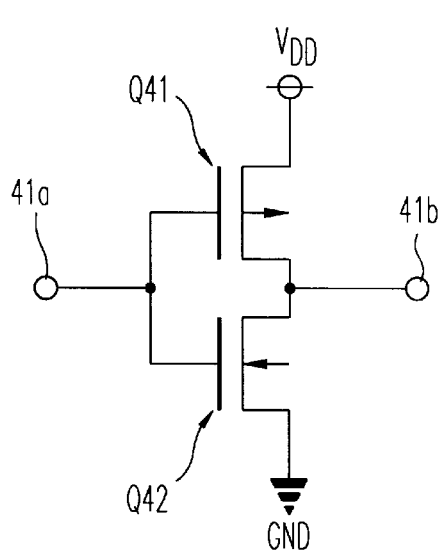
Figure 8C:
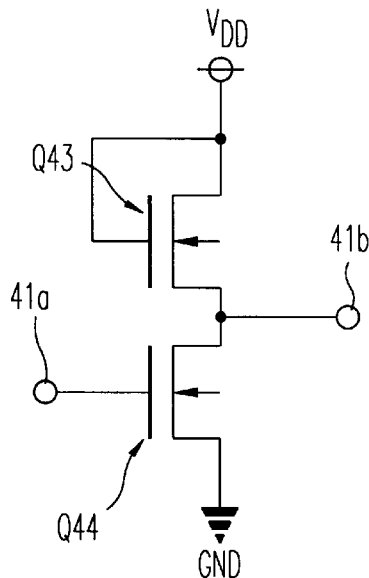
Figure 8D:
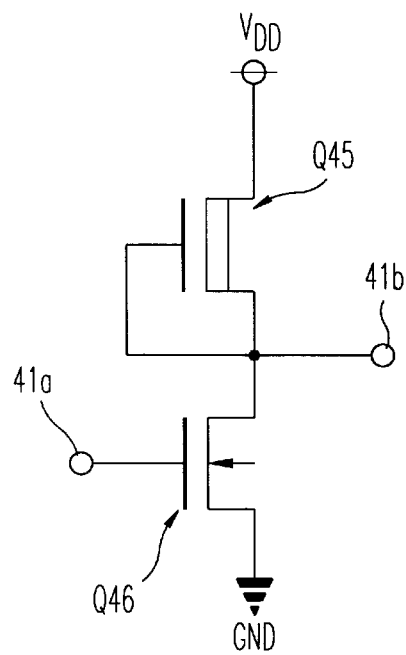

FIGS. 8A to 8D show the inverter 41 and the circuit arrangement thereof. In FIGS. 8A to 8D, reference character 41a designates the input of the inverter 41; 41b designates the output of the inverter 41; Q41 designates an enhancement type PMOS; Q42 to Q44 and Q46 designate enhancement type NMOSs; and Q45 designates a depletion type NMOS. FIG. 8B shows a CMOS inverter, and FIGS. 8C and 8D show an NMOS inverter.

Figure 6:
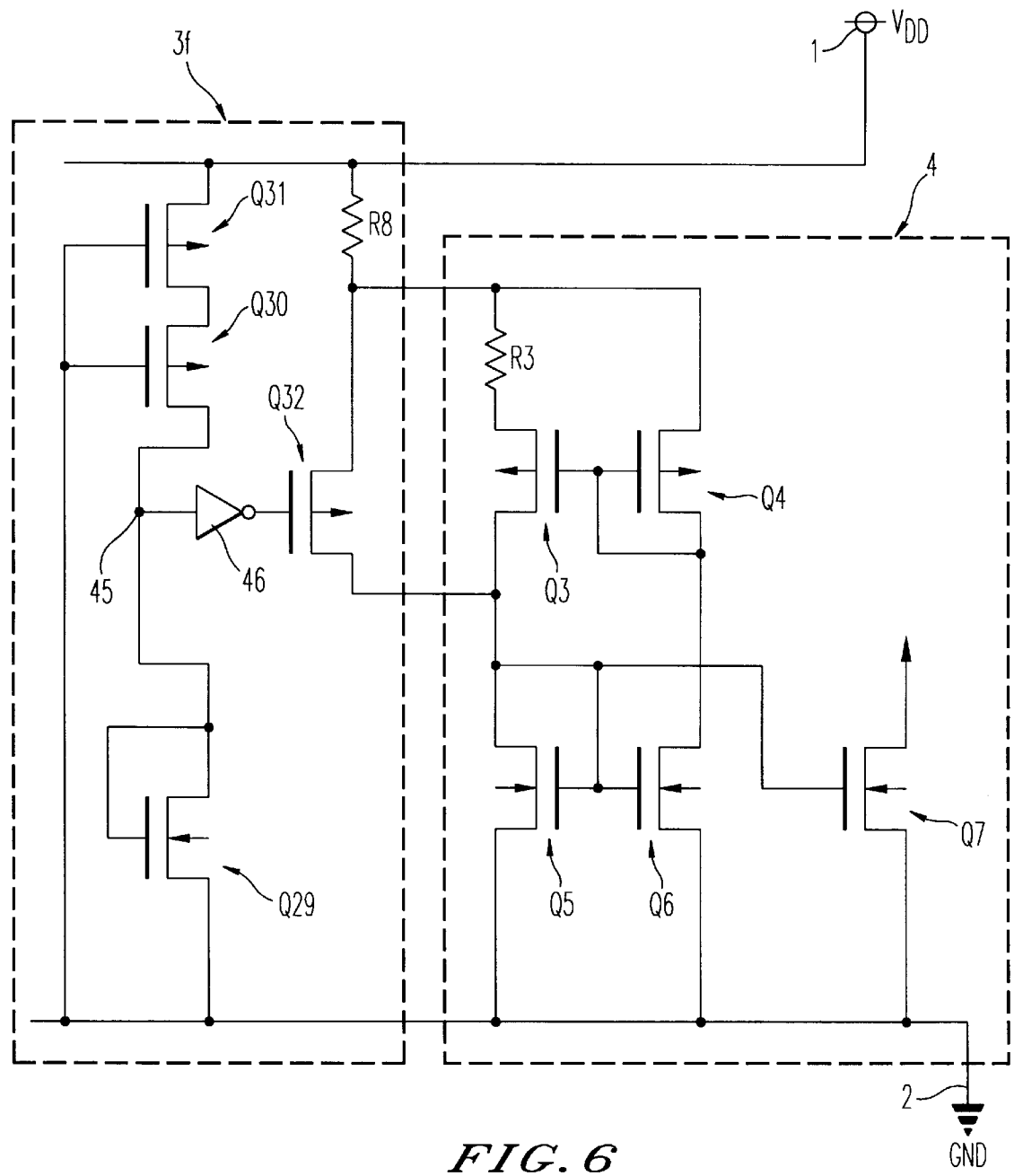
FIG. 6 is a circuit diagram for delineating the start-up circuit according to a fifth preferred embodiment of the present invention.

A fifth preferred embodiment according to the present invention will now be described with reference to FIG. 6. FIG. 6 is a circuit diagram for delineating the start-up circuit including a CMOS according to the fifth preferred embodiment of the present invention. In FIG. 6, a circuit enclosed by the dashed line indicated by reference character 3f is the start-up circuit. A bias supply circuit 4 started by the start-up circuit 3f is similar in construction to the bias supply circuit 4 of FIG. 1.

In FIG. 6, reference character Q29 designates an NMOS having a source connected to the ground potential point 2; R8 designates a resistor having a first end connected to the power-supply potential point 1 and a second end connected to the bias supply circuit 4; Q30 and Q31 designate PMOSs connected in series between the drain of the NMOS Q29 and the power-supply potential point 1 and having a gate connected to the ground potential point 2; and Q32 designates a PMOS having a source connected to the second end of the resistor R8 and a drain connected to the bias supply circuit 4. The PMOS Q32 has a gate connected to the drain of the NMOS Q29 through an inverter 46 and switches on/off in response to a voltage outputted from the inverter 46 in accordance with the drain potential of the NMOS Q29.

Since the inverter 46 switches on/off the PMOS Q32, the on/off operation of the PMOS Q32 is insured by judging whether or not the potential at a node 45 is higher than the threshold voltage of the inverter 46. Thus the resistance of the PMOSs Q30, Q31 should be set such that the threshold voltage of the inverter 46 is sufficiently higher than the potential at the node 45 when the power-supply potential $V_{DD}$ is the operating voltage (5 V).

Figure 9A:
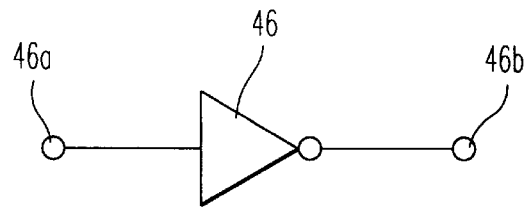
FIGS. 9A to 9D are circuit diagrams of the inverter for use in the start-up circuit of the fifth preferred embodiment.
Figure 9B:
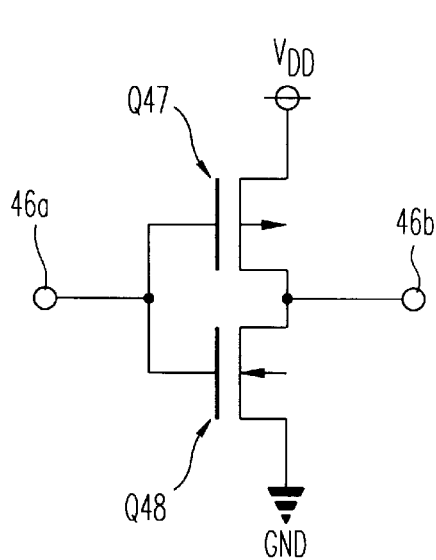
Figure 9C:
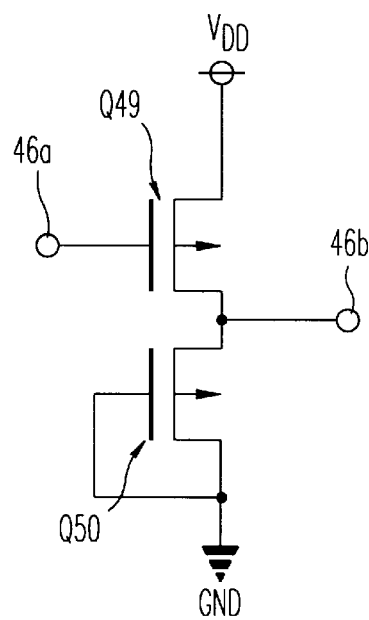
Figure 9D:
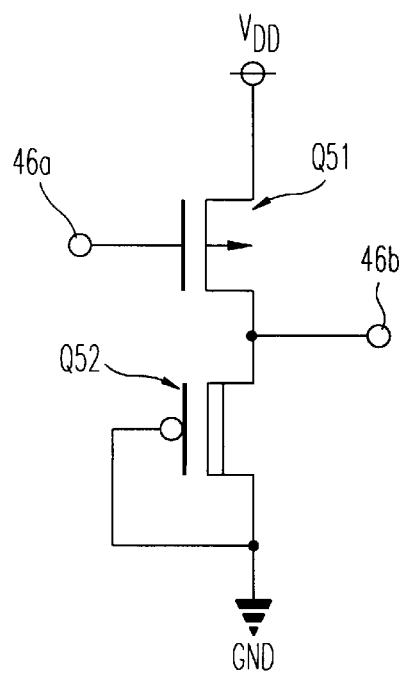

FIGS. 9A to 9D show the inverter 46 and the circuit arrangement thereof. In FIGS. 9A to 9D, reference character 46a designates the input of the inverter 46; 46b designates the output of the inverter 46; Q48 designates an enhancement type NMOS; Q47, Q49 to Q51 designate enhancement type PMOSs; and Q52 designates a depletion type PMOS. FIG. 9B shows a CMOS inverter, and FIGS. 9C and 9D show a PMOS inverter.

Figure 7:
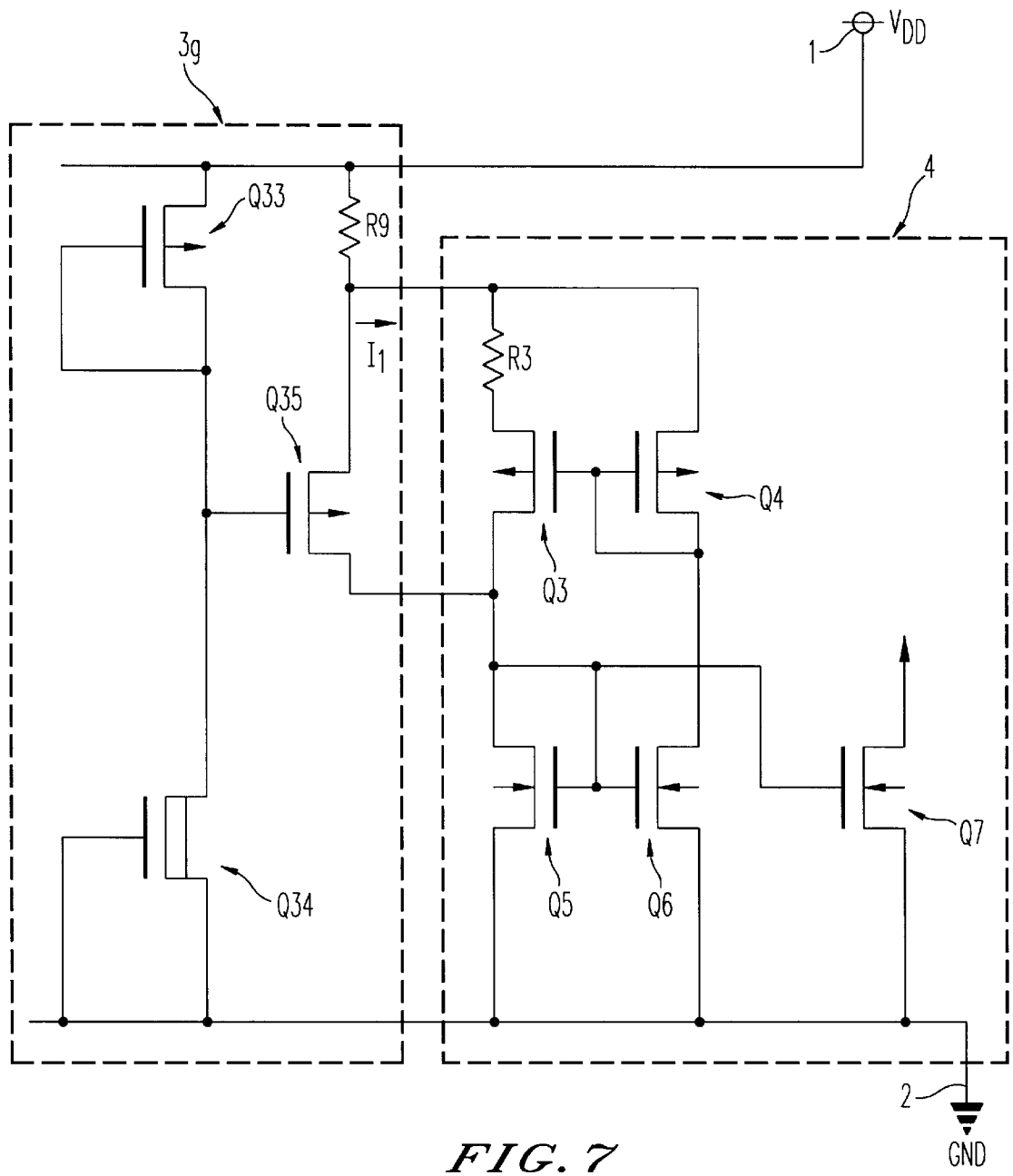
FIG. 7 is a circuit diagram for delineating the start-up circuit according to a sixth preferred embodiment of the present invention.

A sixth preferred embodiment according to the present invention will now be described with reference to FIG. 7. FIG. 7 is a circuit diagram for delineating the start-up circuit including a CMOS according to the sixth preferred embodiment of the present invention. In FIG. 7, a circuit enclosed by the dashed line indicated by reference character 3g is the start-up circuit. A bias supply circuit 4 started by the start-up circuit 3g is similar in construction to the bias supply circuit 4 of FIG. 1.

In FIG. 7, reference character Q33 designates a PMOS having a source connected to the power-supply potential point 1; R9 designates a resistor having a first end connected to the power-supply potential point 1 and a second end connected to the bias supply circuit 4; Q34 designates a depletion type N-channel MOS transistor having a gate connected to the ground potential point 2 and connected between the drain of the PMOS Q33 and the ground potential point 2; and Q35 designates a PMOS having a source connected to the second end of the resistor R9 and a drain connected to the bias supply circuit 4. The PMOS Q35 has a gate connected to the drain of the NMOS Q34 and switches on/off in response to a voltage generated between the drain of the NMOS Q34 and the second end of the resistor R9.

The NMOS Q34 is always on independently of the variation of the power-supply potential $V_{DD}$ because it is of the depletion type and has the gate connected to the ground potential GND. Thus, if the ON-resistance of the NMOS Q34 is approximately equal to the resistance of the resistor R1 of FIG. 10 and other corresponding portions have the same characteristics, the start-up circuit 3g is similar in operation to the conventional start-up circuit 3.

Figure 19:
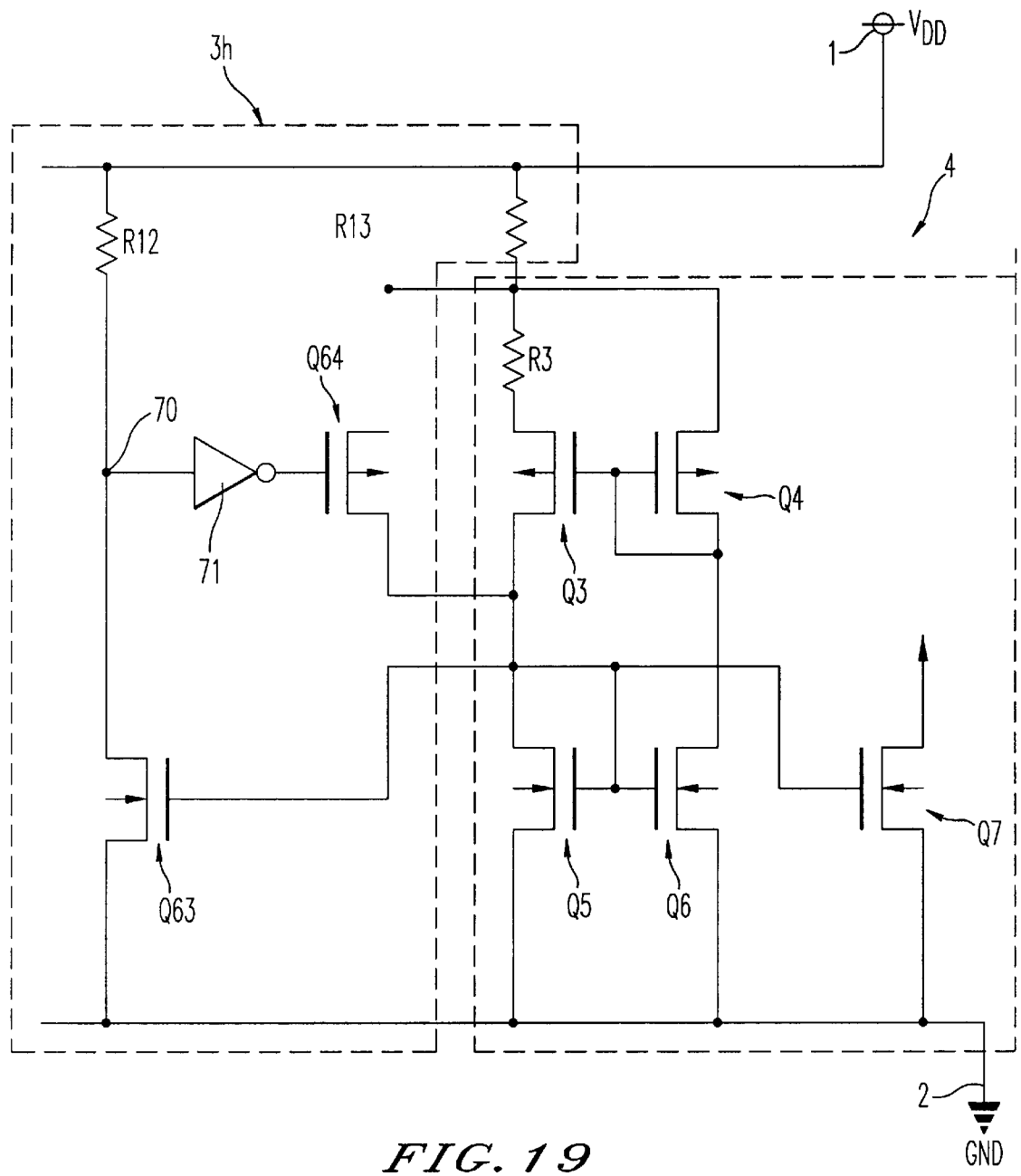
FIG. 19 is a circuit diagram for delineating the start-up circuit according to a seventh preferred embodiment of the present invention.

A seventh preferred embodiment according to the present invention will now be described with reference to FIGS. 19 to 21. FIG. 19 is a circuit diagram showing the start-up circuit and the circuit to be started according to the seventh preferred embodiment of the present invention. In FIG. 19, reference character 3h designates a start-up circuit; R12 designates a resistor having a first end connected to the power-supply potential point 1 and a second end connected to a node 70; Q63 designates an NMOS transistor having a source connected to the ground potential point 2, a drain connected to the node 70, and a gate connected to the bias supply circuit 4; R13 designates a resistor having a first end connected to the power-supply potential point 1 and a second end connected to the first end of the resistor R3 of the bias supply circuit 4; 71 designates an inverter having an input terminal connected to the node 70 and an output terminal for providing an output responsive to the potential at the input terminal; and Q64 designates a PMOS transistor having a source connected to the second end of the resistor R13, a gate connected to the output terminal of the inverter 71, and a drain connected to the drain of the PMOS transistor Q3 of the bias supply circuit 4.

Figure 20:
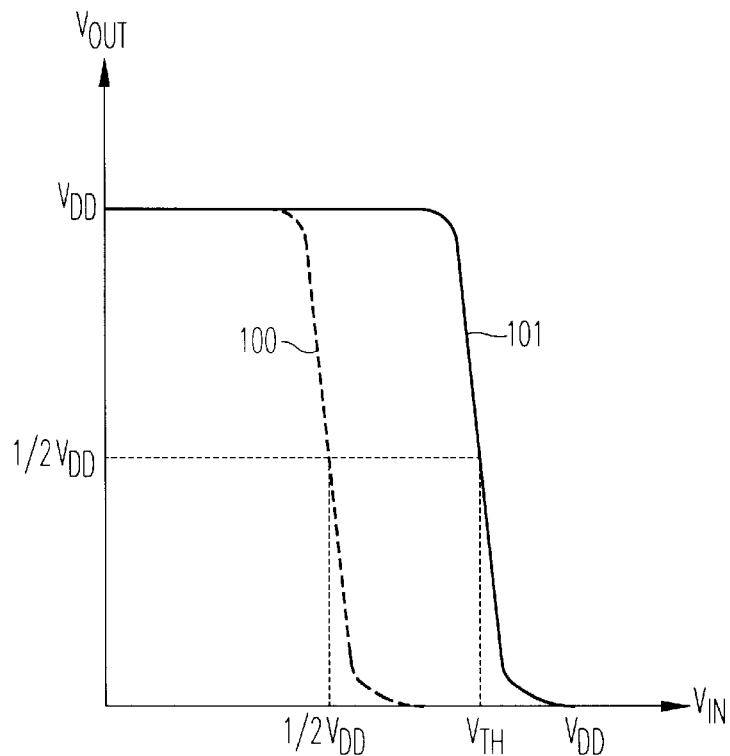
FIG. 20 is a graph for delineating an inverter for use in the start-up circuit of the seventh preferred embodiment.

The inverter 71 having a high threshold voltage as shown in FIG. 20 is used herein. In FIG. 20, 100 represents an input-output characteristic of a standard inverter whose threshold voltage is ($V_{DD}/2$), and 101 represents an input-output characteristic of the inverter 71 of FIG. 19 whose threshold voltage is high enough to be close to $V_{DD}$. In FIG. 20, $V_{IN}$ represents an input voltage of the inverter, and $V_{OUT}$ represents an output voltage thereof. The threshold voltage is preferably in the range of $3 \cdot V_{DD}/4$ to $V_{DD}$, which often provides an optimum design value.

The operation of the start-up circuit 3h shown in FIG. 19 is discussed below. The potential at the node 70 is equal to the potential at the power-supply potential point 1, i.e. $V_{DD}$, immediately after the power supply is put to work since there is no current flow in the NMOS transistor Q63. The potential at the node 70 which is $V_{DD}$ results in the output of the inverter 71 at the GND potential. Then the PMOS transistor Q64 turns on, and the gate potential of the NMOS transistor Q5 rises.

As the gate potential of the NMOS transistor Q5 rises until a current flows in the NMOS transistor Q5, the NMOS transistor Q6 which forms a current mirror circuit with the NMOS transistor Q5 also turns on to cause a drain current to flow. The current flow in the NMOS transistor Q6 causes the gate potential of the PMOS transistor Q4 to fall, and the PMOS transistor Q4 turns on. The PMOS transistor Q3 which forms a current mirror circuit with the PMOS transistor Q4 also turns on and current begins to flow therein. Current flows also in the transistor Q7 which forms a current mirror circuit with the NMOS transistor Q5, and a constant current is supplied through the NMOS transistor Q7.

On the other hand, when current begins to flow in the NMOS transistor Q5, the gate potential of the NMOS transistor Q63 which forms a current mirror circuit with the NMOS transistor Q5 rises and the source-drain resistance of the NMOS transistor Q63 falls. Then a voltage drop in the resistor R12 increases. When the value $V_{DD}-V_{D1}$ is less than the threshold voltage of the inverter 71, where $V_{D1}$ is a voltage generated by the foregoing voltage drop, the output of the inverter 71 is inverted to turn off the PMOS transistor Q64, whereby the start-up circuit 3h turns off.

When the power-supply potential $V_{DD}$ falls instantaneously and the bias supply circuit 4 becomes inoperative, there is no current flow in the NMOS transistor Q5 and the NMOS transistor Q63, and the potential at the node 70 rises again up to $V_{DD}$. Then the output of the inverter 71 is at the GND potential, and the bias supply circuit 4 is again started.

The start-up circuit 3h of the seventh preferred embodiment according to the present invention provides effects to be described below.

(1) The gate potential of the PMOS transistor Q64 is closely related to the threshold voltage of the inverter 71.

Accordingly, the higher the threshold voltage is, the lower the resistance of the resistor R12. This provides for reduction in layout area.

(2) As the drain current of the NMOS transistor Q63 increases or the mirror ratio of the NMOS transistor Q63 to the NMOS transistor Q5 increases, the voltage drop in the resistor R12 increases and the resistance of the resistor 12 decreases. This also provides for reduction in layout area.

The gate potential of the PMOS transistor Q64 may be varied depending upon three parameters, that is, the threshold voltage of the inverter 71, the resistance of the resistor R12, and the current flowing in the resistor R12. A small layout area is attained by selection of a combination of the three parameters which minimizes the layout area.

Figure 21:
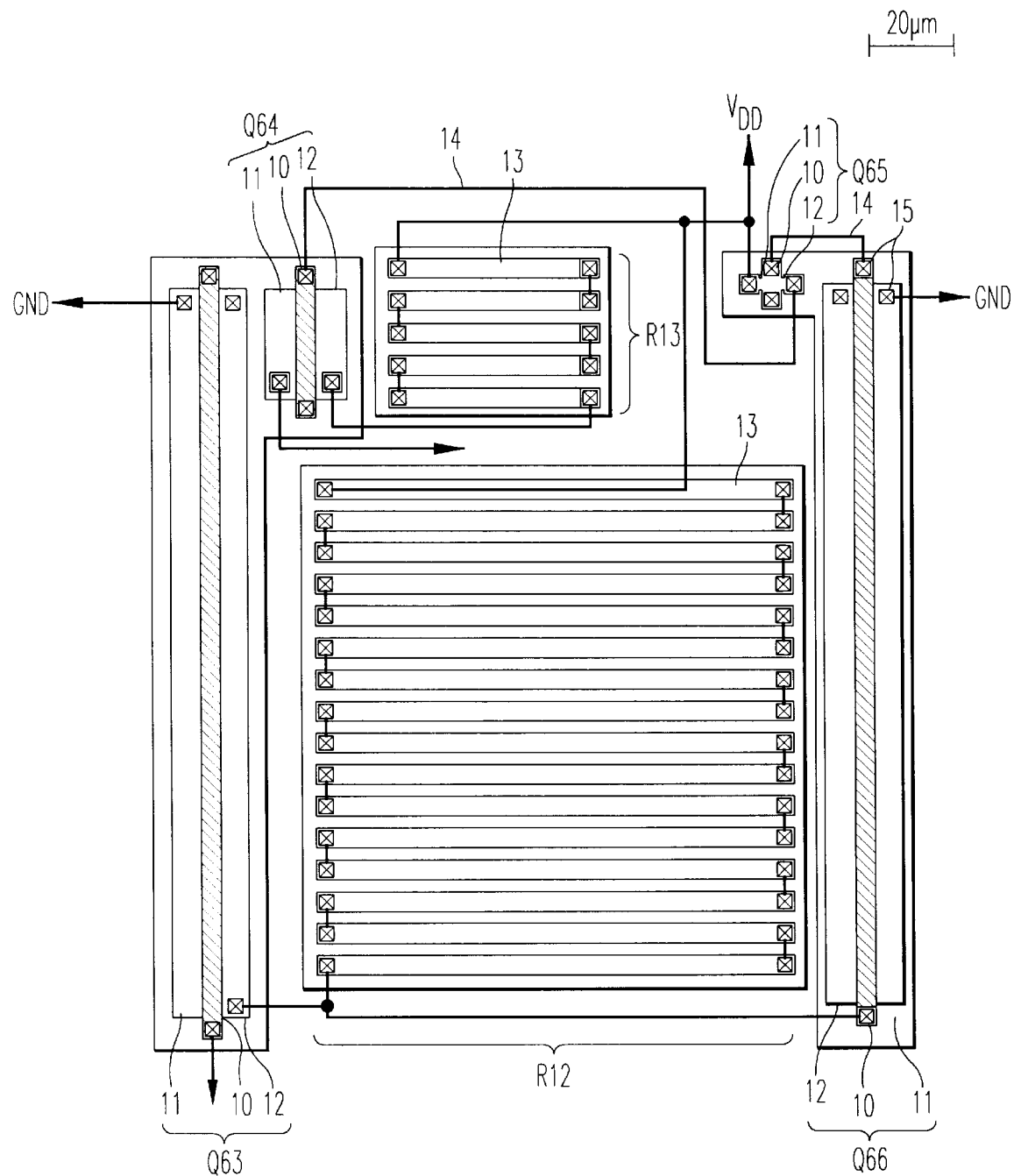
FIG. 21 shows a layout of the start-up circuit of FIG. 20.

FIG. 21 shows a layout of the start-up circuit 3h for the purpose of illustrating reduction in layout area, and is a view enlarged by the same magnification as FIG. 11. In FIG. 21, reference numeral 10 designates a gate electrode; 11 designates a source electrode; 12 designates a drain electrode; 13 designates a diffusion region; 14 designates a line for connection between respective electrodes, between an electrode and a diffusion region, or between diffusion regions; 15 designates a contact hole for connection between the lines 14 and the electrodes or diffusion regions; Q65 designates a PMOS transistor for forming the inverter 71; and Q66 designates an NMOS transistor for forming the inverter 71. Elements of FIG. 21 identical with those of FIG. 19 are designated by the same reference numerals and characters. The resistors R12 and R13 have desired resistances by in-series connection of the plurality of diffusion regions 13 fabricated in the process step of fabricating the PMOS transistor. In order to make the threshold voltage of the inverter 71 to approach the power-supply voltage $V_{DD}$, the PMOS transistor Q65 and the NMOS transistor Q66 are extremely different in size. The ratio W/L of the PMOS transistor Q65 shown in FIG. 21 is 1.5/2.0, and W/L of the NMOS transistor Q66 is 200/2.0.

The high threshold voltage of the inverter 71 permits the low resistance of the resistor R12. The area of the start-up circuit 3h is reduced since the sum of the areas of the PMOS transistor Q65 and the NMOS transistor Q66 is smaller than the area of the conventional resistor R1 of FIG. 11. The threshold voltage of the inverter 71 should not approach the power-supply voltage $V_{DD}$ to an unlimited extent, but there is an optimum size which minimizes the area in order to satisfy the design conditions of the PMOS transistor Q65, the NMOS transistor Q66, and the resistor R12.

Figure 12:
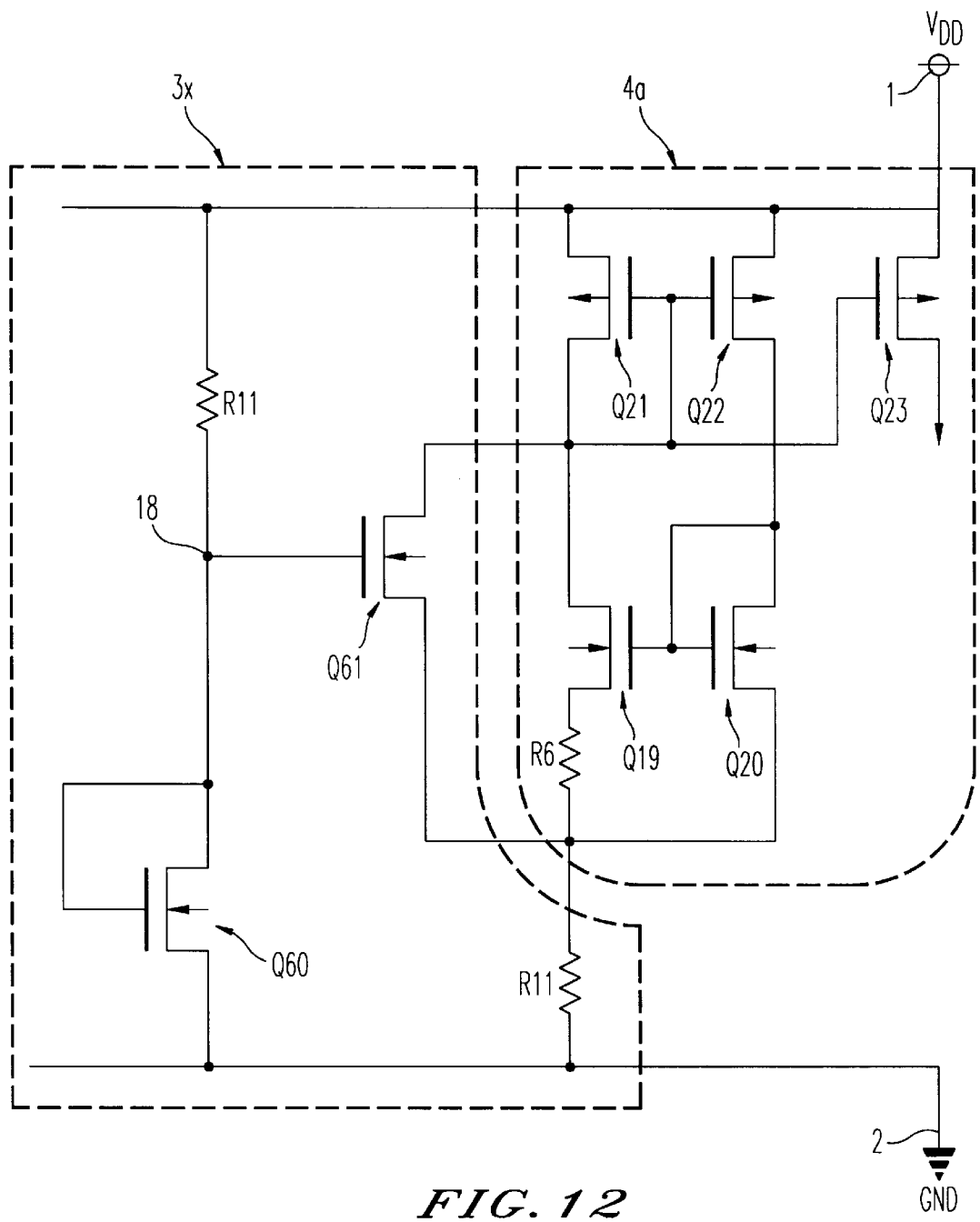
FIG. 12 is a circuit diagram for delineating a conventional start-up circuit.
Figure 24:
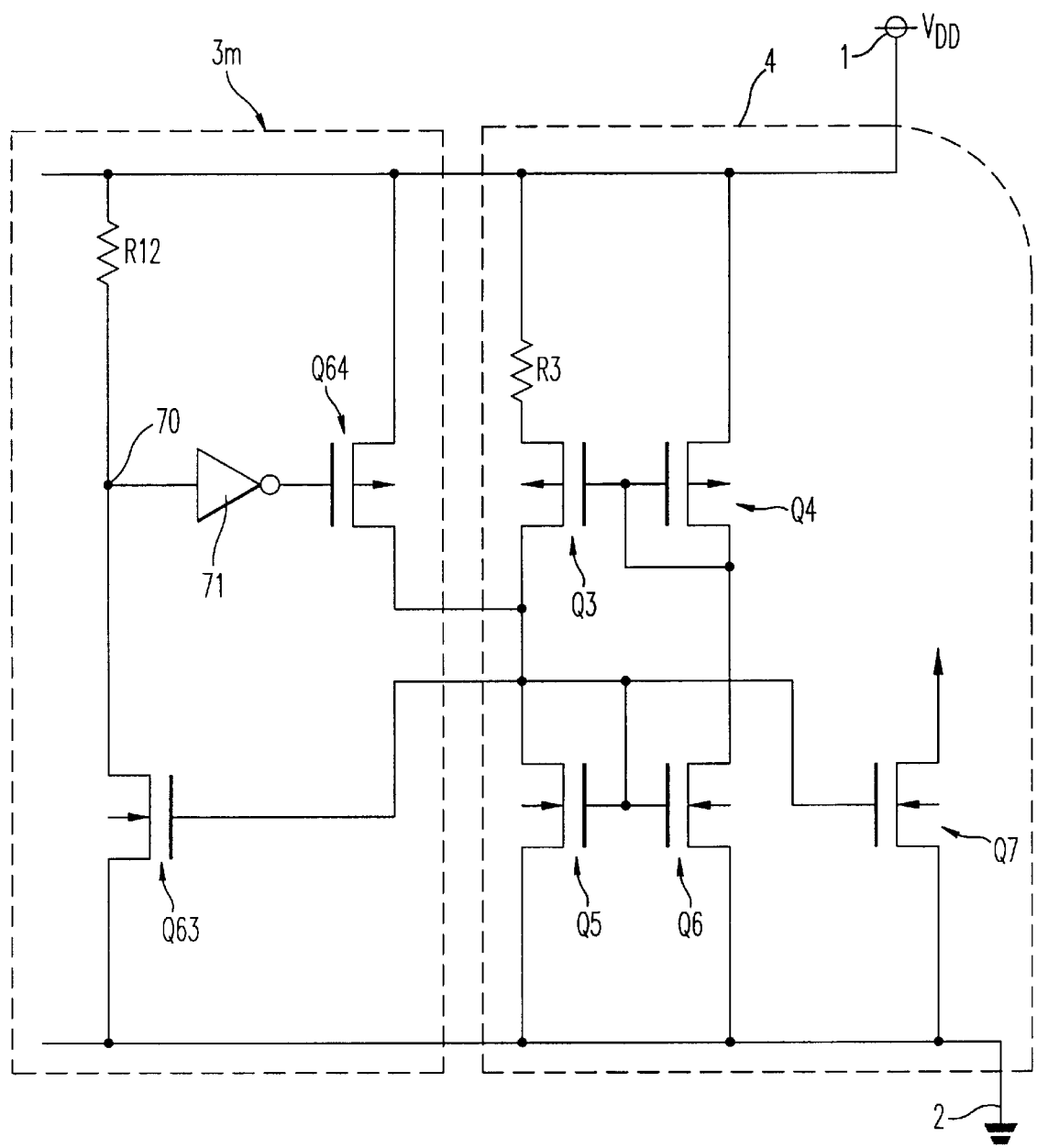
FIG. 24 is a circuit diagram showing another aspect of the start-up circuit of the seventh preferred embodiment.

The resistor R11 of FIG. 12 is designed for switching on/off the NMOS transistor Q61 of FIG. 12 by using the voltage drop in the resistor R11. The resistor R13 of FIG. 19 is designed for reducing a through current during the time interval between the turning-on of the power supply and the turning-off of the PMOS transistor Q64, and may be eliminated when it is unnecessary to care about the through current. This also provides a small layout area, which is shown in FIG. 24. A start-up circuit 3m shown in FIG. 24 is different from the start-up circuit 3h of FIG. 19 only in that the resistor R13 is absent.

Figure 22:
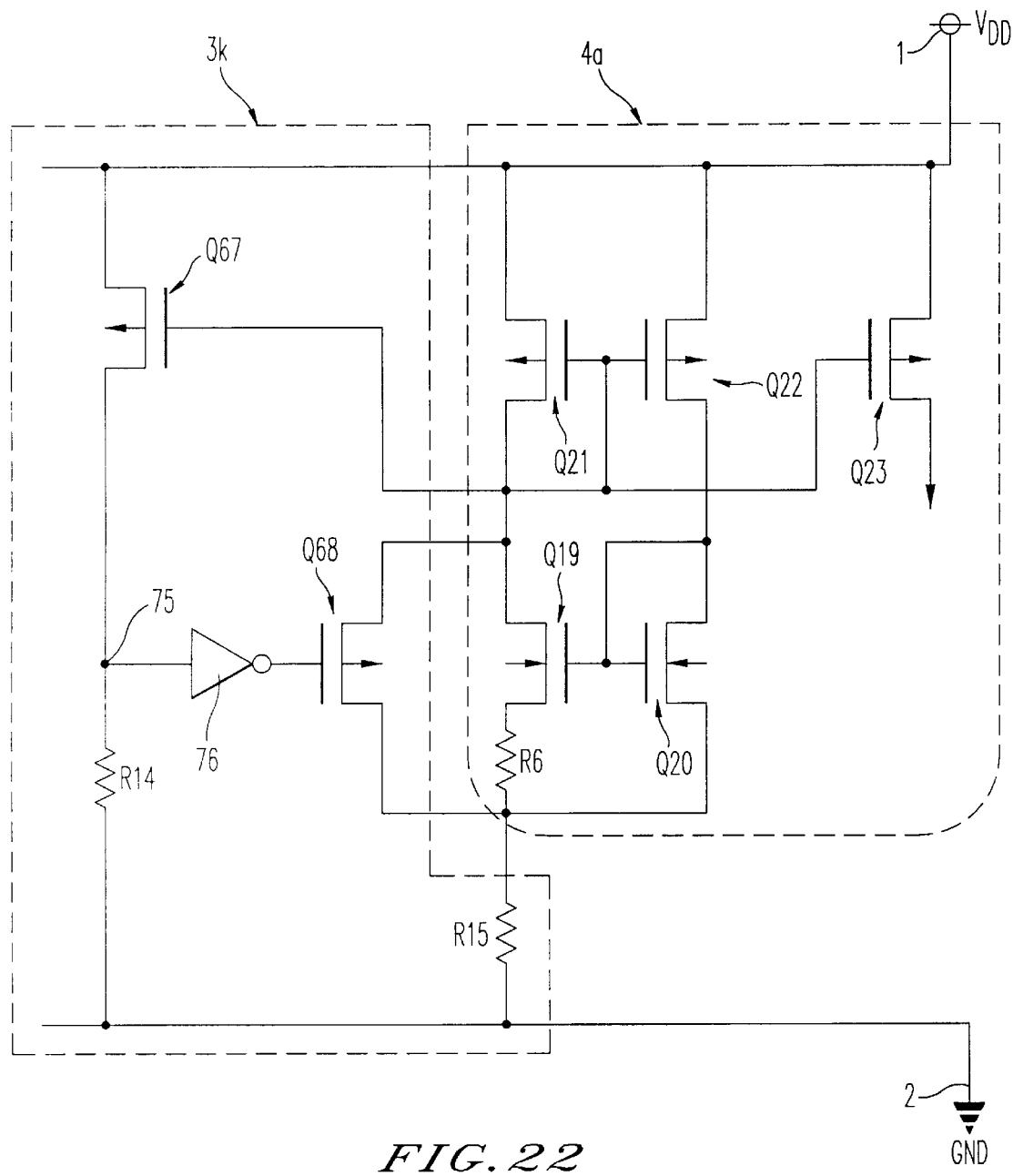
FIG. 22 is a circuit diagram for delineating the start-up circuit according to an eighth preferred embodiment of the present invention.

An eighth preferred embodiment according to the present invention will now be described with reference to FIGS. 22 and 23. FIG. 22 is a circuit diagram showing the start-up circuit and the circuit to be started according to the eighth preferred embodiment of the present invention. In FIG. 22, reference character 3k designates a start-up circuit; R14 designates a resistor having a first end connected to the ground potential point 2 and a second end connected to a node 75; Q67 designates a PMOS transistor having a source connected to the power-supply potential point 1, a drain connected to the node 75, and a gate connected to the drain of the NMOS transistor Q19 of the bias supply circuit 4a; R15 designates a resistor having a first end connected to the ground potential point 2 and a second end connected to the first end of the resistor R6 of the bias supply circuit 4a; 76 designates an inverter having an input terminal connected to the node 75 and an output terminal for providing an output responsive to the potential at the input terminal; and Q68 designates an NMOS transistor having a source connected to the second end of the resistor R15, a gate connected to the output terminal of the inverter 76, and a drain connected to the drain of the NMOS transistor Q19 of the bias supply circuit 4a.

Figure 23:
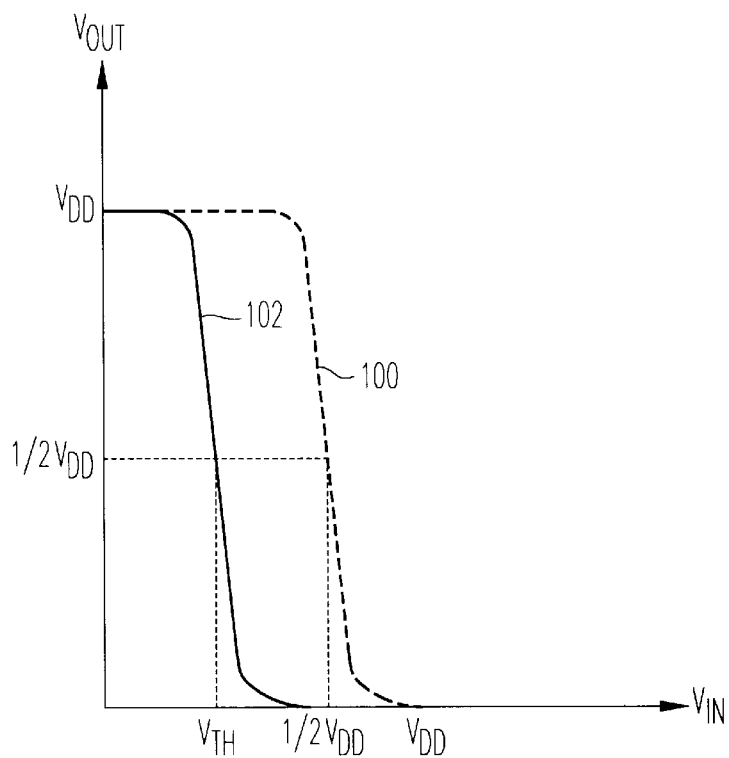
FIG. 23 is a graph for delineating an inverter for use in the start-up circuit of the eighth preferred embodiment.

The inverter 76 having a low threshold voltage as shown in FIG. 23 is used herein. In FIG. 23, $V_{IN}$ represents an input voltage of the inverter, and $V_{OUT}$ represents an output voltage of the inverter. The threshold voltage is preferably in the range of $V_{DD}/4$ to zero, which often provides an optimum design value.

In FIG. 23, 100 represents an input-output characteristic of a standard inverter whose threshold voltage is ($V_{DD}/2$), and 102 represents an input-output characteristic of the inverter of the present invention whose threshold voltage is low enough to be close to the GND voltage.

The layout area of the start-up circuit 3k of the eighth preferred embodiment is reduced for the same reasons as those of the seventh preferred embodiment, but is further reduced for the reasons to be described below.

(1) The low threshold voltage of the inverter 71 permits the PMOS transistor in the inverter to have a small area. An equation for setting a general threshold voltage is:

$$V_{in} = \frac{V_{DD} + V_{thp} + V_{thn}\sqrt{\beta_n/\beta_p}}{1 + \sqrt{\beta_n/\beta_p}} \quad (2)$$

where $V_{in}$ is an input voltage of the inverter; $V_{DD}$ is a power-supply potential; $V_{thp}$ is a threshold voltage of the P-channel transistor; $V_{thn}$ is a threshold voltage of the N-channel transistor; $\beta_n$ is a transistor gain coefficient of the N-channel transistor; and $\beta_p$ is a transistor gain coefficient of the P-channel transistor.

It is common that the transistor gain coefficient $\beta$ of the N-channel transistor is about twice the transistor gain coefficient $\beta$ of the P-channel transistor. To set the threshold voltage at ($V_{DD}/2$), it is necessary that the size of the P-channel transistor is twice the size of the N-channel transistor.

(2) The start-up circuit of the eighth preferred embodiment which includes the NMOS transistor receiving the output of the inverter 71 is smaller in size than that including a PMOS transistor.

Figure 25:
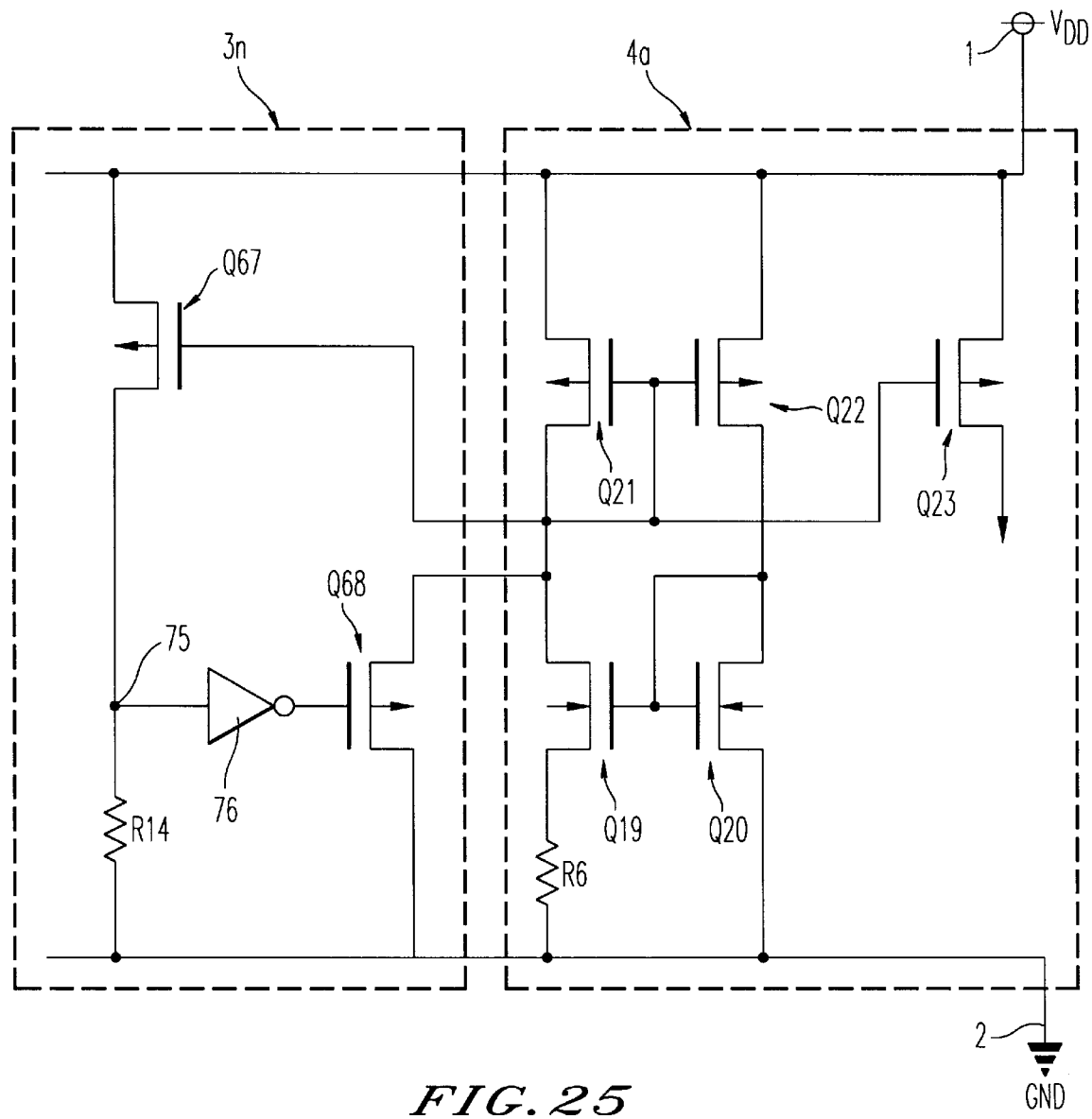
FIG. 25 is a circuit diagram showing another aspect of the start-up circuit of the eighth preferred embodiment.

Similar to the resistor R13 of FIG. 19, the resistor R15 of FIG. 22 may be eliminated. The resistor R15 is designed for reducing the through current during the time interval between the turning-on of the power supply and the turning-off of the NMOS transistor Q68, and may be eliminated when it is unnecessary to care the through current. This provides a small layout area, which is shown in FIG. 25. A start-up circuit 3n shown in FIG. 25 is different from about the start-up circuit 3k of FIG. 22 only in that the resistor R15 is absent.

In the above-mentioned preferred embodiments, the MOS transistors are used to form the start-up circuit and the circuit to be started. However, the start-up circuit and the circuit to be started may include other insulated gate transistors, which provide effects similar to those of the preferred embodiments.

While the invention has been shown and described in detail, the foregoing description is in all aspects illustrative and not restrictive. It is therefore understood that numerous modifications and variations can be devised without departing from the scope of the invention.

What is claimed is:

1. A start-up circuit formed in a semiconductor integrated circuit including an insulated gate transistor of a first conductivity type and an insulated gate transistor of a second conductivity type, and connected to first and second power-supply potentials and to a circuit-to-be-started conducting a current between said first and second power-supply potentials when started for starting said circuit-to-be-started, said start-up circuit comprising:

at least one first insulated gate transistor, including at least one MOS transistor, having a gate connected to said first power-supply potential, and a source connected to said second power-supply potential;

diode means including a second insulated gate transistor connected in series with said first insulated gate transistor in the forward direction between said first power-supply potential and said first insulated gate transistor and having an anode and a cathode for generating a predetermined voltage drop between said anode and said cathode when it is on, a drain of the at least one first insulated gate transistor being connected to a drain of the second insulated gate transistor, said diode means being producible by the process step of fabricating said insulated gate transistor of the first conductivity type and said insulated gate transistor of the second conductivity type;

an inverter having an input connected to said cathode of said diode means and an output for outputting said first power-supply potential when the potential at said input is closer to said second power-supply potential than to a predetermined potential and outputting said second power-supply potential when the potential at said input is closer to said first power-supply potential than to said predetermined potential, said inverter being producible by the process step of fabricating said insulated gate transistor of the first conductivity type and said insulated gate transistor of the second conductivity type;

voltage drop means having a first end connected to said first or second power-supply potential and a second end connected to said circuit-to-be-started and having a predetermined resistance between said first end and said second end for causing the current between said first and second power-supply potentials to flow in said circuit-to-be-started when started, said voltage drop means being producible by the process step of fabricating said insulated gate transistor of the first conductivity type and said insulated gate transistor of the second conductivity type; and switching means having an input terminal connected to said second end of said voltage drop means, an output terminal connected to said circuit-to-be-started, and a control terminal connected to said output of said inverter for accomplishing connection/disconnection between said input terminal and said output terminal in accordance with a potential difference between said control terminal and said input terminal, said switching means being producible by the process step of fabricating said insulated gate transistor of the first conductivity type and said insulated gate transistor of the second conductivity type.

2. The start-up circuit of claim 1, wherein said diode means includes the second insulated gate transistor having a source connected to said first power-supply potential, and a gate and drain connected to said control terminal of said switching means, said second insulated gate transistor being producible by the process step of fabricating said insulated gate transistor of the first conductivity type and said insulated gate transistor of the second conductivity type.

3. The start-up circuit of claim 2, wherein said first power-supply potential is higher than said second power-supply potential;

said insulated gate transistor of the first conductivity type and said insulated gate transistor of the second conductivity type include a CMOS transistor;

said at least one first insulated gate transistor including the at least one MOS transistor includes at least one N-channel MOS transistor; and said second insulated gate transistor includes a P-channel MOS transistor having a source connected to said first power-supply potential, and a gate and drain connected to said input of said inverter.

4. The start-up circuit of claim 2, wherein said first power-supply potential is higher than said second power-supply potential;

said insulated gate transistor of the first conductivity type and said insulated gate transistor of the second conductivity type include a CMOS transistor;

said at least one first insulated gate transistor includes a plurality of N-channel MOS transistors having a gate connected to said first power-supply potential, a source and a drain and connected in series between said drain of said second insulated gate transistor and said second power-supply potential; and said second insulated gate transistor includes a P-channel MOS transistor having a source connected to said first power-supply potential, and a gate and drain connected to said input of said inverter.

5. The start-up circuit of claim 4, wherein said voltage drop means includes a diffused resistor having a first end connected to said second power-supply potential and a second end connected to said circuit-to-be-started and having said predetermined resistance between said first end and said second end, and said switching means includes an N-channel MOS transistor having a source connected to said second end of said voltage drop means, a drain connected to said circuit-to-be-started, and a gate connected to said output of said inverter.

6. The start-up circuit of claim 5, wherein said plurality of N-channel MOS transistors include enhancement type N-channel MOS transistors.

7. The start-up circuit of claim 2, wherein said first power-supply potential is lower than said second power-supply potential;

said insulated gate transistor of the first conductivity type and said insulated gate transistor of the second conductivity type include a CMOS transistor;

said at least one first insulated gate transistor including the at least one MOS transistor includes at least one P-channel MOS transistor; and said second insulated gate transistor includes an N-channel MOS transistor having a source connected to said first power-supply potential, and a gate and drain connected to said input of said inverter.

8. The start-up circuit of claim 2, wherein said first power-supply potential is lower than said second power-supply potential;

said insulated gate transistor of the first conductivity type and said insulated gate transistor of the second conductivity type include a CMOS transistor;

said at least one first insulated gate transistor including the at least one MOS transistor includes a plurality of P-channel MOS transistors having a gate connected to said first power-supply potential, a source and a drain and connected in series between said second power-supply potential and said drain of said second insulated gate transistor; and said second insulated gate transistor includes an N-channel MOS transistor having a source connected to said first power-supply potential, and a gate and drain connected to said input of said inverter.

9. The start-up circuit of claim 8, wherein said voltage drop means includes a diffused resistor having a first end connected to said second power-supply potential and a second end connected to said circuit-to-be-started and having said predetermined resistance between said first end and said second end, and said switching means includes P-channel MOS transistor having a source connected to said second end of said voltage drop means, a drain connected to said circuit-to-be-started, and a gate connected to said output of said inverter.

10. The start-up circuit of claim 9, wherein said plurality of P-channel MOS transistors include enhancement type P-channel MOS transistors.

11. The start-up circuit of claim 1, wherein said insulated gate transistor of the first conductivity type and said insulated gate transistor of the second conductivity type include a CMOS transistor; and said voltage drop means includes a diffused resistor having a first end connected to said first or second power-supply potential and a second end connected to said circuit-to-be-started and having said predetermined resistance between said first end and said second end, said diffused resistor being producible by the process step of fabricating said insulated gate transistor of the first conductivity type and said insulated gate transistor of the second conductivity type.

12. The start-up circuit of claim 1, wherein said switching means includes a second insulated gate transistor having a first electrode connected to said second end of said voltage drop means, a second electrode connected to said circuit-to-be-started, and a control electrode connected to said output of said inverter, said second insulated gate transistor being producible by the process step of fabricating said insulated gate transistor of the first conductivity type and said insulated gate transistor of the second conductivity type.

13. The start-up circuit of claim 1, wherein said insulated gate transistor of the first conductivity type and said insulated gate transistor of the second conductivity type include a CMOS transistor; and said inverter includes a CMOS inverter having a P-channel MOS transistor and an N-channel MOS transistor connected in series between said first power-supply potential and said second power-supply potential.

14. A start-up circuit formed in a semiconductor integrated circuit including an insulated gate transistor of a first conductivity type and an insulated gate transistor of a second conductivity type, and connected to first and second power-supply potentials and to a circuit-to-be-started conducting a current between said first and second power-supply potentials when started for starting said circuit-to-be-started, said start-up circuit comprising:

a plurality of first insulated gate transistors, including a plurality of MOS transistors, having a gate connected commonly to said first power-supply potential, a source and a drain and connected in series between said second power-supply potential and a node;

diode means including a second insulated gate transistor connected in series with said plurality of first insulated gate transistors in the forward direction between said first power-supply potential and said node and having an anode and a cathode for generating a predetermined voltage drop between said anode and said cathode when it is on;

an inverter having an input connected to said node and an output for outputting said first power-supply potential when the potential at said input is closer to said second power-supply potential than to a predetermined potential and outputting said second power-supply potential when the potential at said input is closer to said first power-supply potential than to said predetermined potential;

voltage drop means having a first end connected to said first or second power-supply potential and a second end connected to said circuit-to-be-started and having a predetermined resistance between said first end and said second end for causing the current between said first and second power-supply potentials to flow in said circuit-to-be-started when started; and switching means having an input terminal connected to said second end of said voltage drop means, an output terminal connected to said circuit-to-be-started, and a control terminal connected to said output of said inverter for accomplishing connection/disconnection between said input terminal and said output terminal in accordance with a potential difference between said control terminal and said input terminal.

15. The start-up circuit of claim 14, wherein said diode means includes the second insulated gate transistor having a source connected to said first power-supply potential, and a gate and drain connected to said control terminal of said switching means.

16. The start-up circuit of claim 15, wherein said first power-supply potential is higher than said second power-supply potential;

said insulated gate transistor of the first conductivity type and said insulated gate transistor of the second conductivity type include a CMOS transistor;

said plurality of first insulated gate transistors including the plurality of MOS transistors further include a plurality of N-channel MOS transistors; and said second insulated gate transistor includes a P-channel MOS transistor having a source connected to said first power-supply potential, and a gate and drain connected to said node.

17. The start-up circuit of claim 16, wherein said voltage drop means includes a diffused resistor having a first end connected to said second power-supply potential and a second end connected to said circuit-to-be-started and having said predetermined resistance between said first end and said second end, and said switching means includes an N-channel MOS transistor having a source connected to said second end of said voltage drop means, a drain connected to said circuit-to-be-started, and a gate connected to said output of said inverter.

18. The start-up circuit of claim 17, wherein said plurality of N-channel MOS transistors include enhancement type N-channel MOS transistors.

19. The start-up circuit of claim 15, wherein said first power-supply potential is lower than said second power-supply potential;

said insulated gate transistor of the first conductivity type and said insulated gate transistor of the second conductivity type include a CMOS transistor;

said plurality of first insulated gate transistors including the plurality of MOS transistors further include a plurality of P-channel MOS transistors; and said second insulated gate transistor includes an N-channel MOS transistor having a source connected to said first power-supply potential, and a gate and drain connected to said node.

20. The start-up circuit of claim 19, wherein said voltage drop means includes a diffused resistor having a first end connected to said second power-supply potential and a second end connected to said circuit-to-be-started and having said predetermined resistance between said first end and said second end, and said switching means includes a P-channel MOS transistor having a source connected to said second end of said voltage drop means, a drain connected to said circuit-to-be-started, and a gate connected to said output of said inverter.

21. The start-up circuit of claim 20, wherein said plurality of P-channel MOS transistors include enhancement type P-channel MOS transistors.

22. The start-up circuit of claim 14, wherein said insulated gate transistor of the first conductivity type and said insulated gate transistor of the second conductivity type include a CMOS transistor; and said voltage drop means includes a diffused resistor having a first end connected to said first or second power-supply potential and a second end connected to said circuit-to-be-started and having said predetermined resistance between said first end and said second end.

23. The start-up circuit of claim 14, wherein said switching means includes an insulated gate transistor having a first electrode connected to said second end of said voltage drop means, a second electrode connected to said circuit-to-be-started, and a control electrode connected to said output of said inverter.

24. The start-up circuit of claim 14, wherein said inverter includes a CMOS inverter having a P-channel MOS transistor and an N-channel MOS transistor connected in series between said first power-supply potential and said second power-supply potential.

25. A start-up circuit formed in a semiconductor integrated circuit including an insulated gate transistor of a first conductivity type and an insulated gate transistor of a second conductivity type, and connected to first and second power-supply potentials and to a circuit-to-be-started conducting a current between said first and second power-supply potentials when started for starting said circuit-to-be-started, said start-up circuit comprising:

voltage drop means having a first end connected to said first power-supply potential and a second end;

first switching means, including at least one MOS transistor having a drain connected to said second end of said voltage drop means, a second end connected to said second power-supply potential, and a control terminal connected to said circuit-to-be-started, said first switching means having a relatively high resistance between said first and second ends when said circuit-to-be-started is not started and having a relatively low resistance therebetween when said circuit-to-be-started is started;

an inverter having an input terminal connected to said second end of said voltage drop means and an output terminal, said inverter outputting said second power-supply potential when the potential at said input terminal is closer to said first power-supply potential than to a predetermined threshold voltage and outputting said first power-supply potential when the potential at said input terminal is closer to said second power-supply potential than to said predetermined threshold voltage; and second switching means having first and second ends connected respectively to two predetermined connecting points of said circuit-to-be-started and a control terminal connected to said output terminal of said inverter, said second switching means being conductive when said inverter outputs said first power-supply potential and being non-conductive when said inverter outputs said second power-supply potential.

26. The start-up circuit of claim 25, wherein said threshold voltage of said inverter is made closer to said first power-supply potential and said voltage drop means lowers the resistance between said first and second ends thereof so that the sum of the area of said inverter and the area of said voltage drop means is minimized within an allowable range of design conditions for said inverter and said voltage drop means.

27. The start-up circuit of claim 25, further comprising:

current limiting means having a first end connected to said first power-supply potential and a second end connected to said first end of said second switching means, said current limiting means serving as a current path for supplying current to said circuit-to-be-started when said circuit-to-be-started is started and limiting a current flowing through said circuit-to-be-started when said second switching means is conductive.

28. The start-up circuit of claim 27, wherein
said voltage drop means includes a diffused resistor having a first end connected to said first power-supply potential and a second end connected to said first end of said first switching means.

29. The start-up circuit of claim 27, wherein said at least one MOS transistor of the first switching means has a source connected to said second power-supply potential, and a gate connected to said circuit-to-be-started, said MOS transistor being on when said circuit-to-be-started is not started and being off when said circuit-to-be-started is started.

30. The start-up circuit of claim 27, wherein
said inverter includes a complementary inverter having said insulated gate transistor of the first conductivity type and said insulated gate transistor of the second conductivity type.

31. The start-up circuit of claim 27, wherein
said second switching means includes
a MOS transistor having source and drain connected respectively to two predetermined connecting points of said circuit-to-be-started and a gate connected to said output terminal of said inverter, said MOS transistor being on when said inverter outputs said first power-supply potential and being off when said inverter outputs said second power-supply potential.

* * * * *